US008675369B2

(12) United States Patent
Takatori et al.

(10) Patent No.: US 8,675,369 B2
(45) Date of Patent: Mar. 18, 2014

(54) MODULE BOARD

(75) Inventors: Masahiro Takatori, Osaka (JP);
Yukihiro Ishimaru, Osaka (JP)

(73) Assignee: Panasonic Corporation, Osaka (JP)

( * ) Notice: Subject to any disclaimer, the term of this patent is extended or adjusted under 35 U.S.C. 154(b) by 180 days.

(21) Appl. No.: 13/299,842

(22) Filed: Nov. 18, 2011

(65) Prior Publication Data

US 2012/0063110 A1 Mar. 15, 2012

Related U.S. Application Data

(63) Continuation of application No. 11/908,726, filed as application No. PCT/JP2006/305125 on Mar. 15, 2006, now Pat. No. 8,077,478.

(30) Foreign Application Priority Data

Mar. 17, 2005 (JP) .................................. 2005-076806

(51) Int. Cl.
*H05K 1/11* (2006.01)
*H05K 1/14* (2006.01)
*H05K 7/00* (2006.01)

(52) U.S. Cl.
USPC ........... 361/793; 361/760; 361/790; 361/795; 174/260; 174/261; 174/262

(58) Field of Classification Search
None
See application file for complete search history.

(56) References Cited

U.S. PATENT DOCUMENTS

| | | | |
|---|---|---|---|
| 5,200,362 A | 4/1993 | Lin et al. | |
| 5,239,198 A | 8/1993 | Lin et al. | |
| 5,273,938 A | 12/1993 | Lin et al. | |
| 5,579,207 A | 11/1996 | Hayden et al. | |
| 5,646,828 A * | 7/1997 | Degani et al. | 361/715 |
| 5,661,647 A | 8/1997 | Washburn et al. | |
| 5,754,410 A | 5/1998 | Bardsley et al. | |
| 5,872,700 A * | 2/1999 | Collander | 361/760 |
| 5,963,430 A | 10/1999 | Londa | |
| 6,094,056 A | 7/2000 | Bardsley et al. | |
| 6,101,100 A * | 8/2000 | Londa | 361/761 |
| 6,285,559 B1 * | 9/2001 | Fukiharu | 361/760 |
| 6,339,256 B2 * | 1/2002 | Akram | 257/691 |
| 6,480,395 B1 * | 11/2002 | Kopf | 361/760 |

(Continued)

FOREIGN PATENT DOCUMENTS

JP 63-265451 11/1988
JP 6-077398 3/1994

(Continued)

OTHER PUBLICATIONS

Japan Office action, mail date is Apr. 9, 2013.
Search report from E.P.O., mail date is Nov. 22, 2010.
Korean Office action, mail date Apr. 18, 2012.

*Primary Examiner* — Boris Chervinsky
(74) *Attorney, Agent, or Firm* — Greenblum & Bernstein P.L.C.

(57) ABSTRACT

A module board has a configuration in which a first circuit board, a first composite sheet, a second circuit board, a second composite sheet, and a third circuit board are laminated in this order. Inspection terminals are arranged in a matrix shape in a predetermined region on an upper surface of the third circuit board. Electronic components are mounted on the first and second circuit boards. The inspection terminals are electrically connected to the electronic components mounted on the first and second circuit boards through vias and wiring patterns.

12 Claims, 16 Drawing Sheets

(56) References Cited

U.S. PATENT DOCUMENTS

| | | |
|---|---|---|
| 6,483,718 B2 | 11/2002 | Hashimoto |
| 6,628,527 B2 | 9/2003 | Muramatsu et al. |
| 6,657,523 B2 * | 12/2003 | Tarui et al. .................... 333/246 |
| 6,890,798 B2 | 5/2005 | McMahon |
| 6,989,600 B2 * | 1/2006 | Kubo et al. .................... 257/758 |
| 7,161,371 B2 | 1/2007 | Higashitani et al. |
| 7,309,838 B2 * | 12/2007 | Noguchi ....................... 174/255 |
| 7,354,800 B2 | 4/2008 | Garson |
| 7,423,418 B2 * | 9/2008 | Higashitani et al. ..... 324/756.01 |
| 7,457,129 B2 * | 11/2008 | Ikezawa et al. ............... 361/735 |
| 7,485,489 B2 | 2/2009 | Bjorbell |
| 2003/0148558 A1 | 8/2003 | Kubo et al. |
| 2003/0159852 A1 | 8/2003 | Nakamura |
| 2004/0063340 A1 | 4/2004 | Nakamura |
| 2004/0066634 A1 | 4/2004 | Nakamura |
| 2005/0246891 A1 | 11/2005 | Nakamura |
| 2006/0191715 A1 | 8/2006 | Koyama et al. |
| 2007/0148829 A1 | 6/2007 | Yoshino et al. |

FOREIGN PATENT DOCUMENTS

| | | |
|---|---|---|
| JP | 8-78572 | 3/1996 |
| JP | 10-012809 | 1/1998 |
| JP | 10-104322 | 4/1998 |
| JP | 10-189815 | 7/1998 |
| JP | 2000-68440 | 3/2000 |
| JP | 2001-111232 | 4/2001 |
| JP | 2003-86733 | 3/2003 |
| JP | 2005-026573 | 1/2005 |
| WO | 01/82367 | 11/2001 |

* cited by examiner

MODULE BOARD

CROSS REFERENCE OF RELATED APPLICATIONS

The present application is a continuation of U.S. application Ser. No. 11/908,726, filed Sep. 14, 2007, which is a National Stage Application of PCT/JP2006/305125 filed Mar. 15, 2006 the disclosures of which are incorporated herein by reference in their entireties.

TECHNICAL FIELD

The present invention relates to a module board having an electronic component such as an LSI (Large Scale Integrated Circuit) or an IC (Integrated Circuit) mounted thereon.

BACKGROUND ART

In recent years, digital appliances such as digital televisions have been spreading in general homes. To make products sophisticated and multifunctional holds the key to the spread of the digital appliances.

The performance of the digital appliances can be improved by increasing the speed of digital signal processing. To increase the speed of the digital signal processing can be realized by improving the clock frequencies of system LSIs, expanding the widths of data buses, and using high-speed memories such as DDR (Double Data Rate) memories, for example.

Furthermore, in order to increase the functions of the digital appliances, the high integration densities of circuits are required. To increase the integration densities of the circuits can be realized by placing a plurality of electronic components within one package by techniques such as MCM (Multi Chip Module) or SIP (System In Package), for example.

Although a large number of functions can be carried in the products by increasing the integration densities of the circuits, however, the number of interface signals required for the respective functions to operate also increases. Thus, the number of external terminals provided outside the package also increases. As the number of electronic components accommodated within the package increases, the number of external terminals for inspecting the electronic components also increases. Although the package is electrically connected to external boards through the external terminals, the increase in the number of external terminals makes it difficult to miniaturize the package.

In an IC package in Patent Document 1, for example, therefore, a lower-stage lead terminal is provided on the first layer of a lead board having a double-layer structure, and an upper-stage lead terminal serving as a testing terminal is provided on the second layer thereof. In this configuration, the upper-stage lead terminal provided on the second layer of the lead board is not connected to the circuit board. That is, the testing terminal is provided on the second layer of the lead terminal, to reduce the number of terminals to be provided in a region (on the first layer of the lead board) to which the circuit board is connected. This makes it conceivable that the IC package can be miniaturized.

[Patent Document 1] JP 2000-68440 A

DISCLOSURE OF THE INVENTION

Problems to be Solved by the Invention

In the configuration of the IC package in Patent Document 1, described above, however, the lead board must have a double-layer structure in order to provide the testing terminal. In this case, a board, which is not functionally required, serving as an electronic component is provided, so that the manufacturing cost and the number of manufacturing processes increase.

Since the testing terminal is formed on the second layer of the lead board, the length of a wire for connecting the testing terminal and an IC chip increases. In this case, it is difficult to provide impedance matching between the testing terminal and the IC chip. This causes a reflected wave to be generated at the testing terminal or an end of the wire when the IC chip is inspected, so that a waveform strain is induced in an inspection signal. As a result, it is difficult to accurately inspect the IC chip.

Means for Solving the Problems

An object of the present invention is to provide a small-sized module board that can reliably inspect an electronic component and the manufacturing cost of which is prevented from increasing.

(1)

A module board according to an aspect of the present invention includes a plurality of circuit boards laminated in the vertical direction and each having a wiring pattern, one or a plurality of electronic components mounted on at least one of the plurality of circuit boards and electrically connected to the wiring pattern, a first terminal provided on a lower surface of the lowermost one of the plurality of circuit boards and electrically connected to the wiring pattern, and a second terminal provided so as to be exposed to an upper surface of any one of the plurality of circuit boards and electrically connected to the wiring pattern.

In the module board, the plurality of circuit boards each having the wiring pattern are laminated in the vertical direction. The one or plurality of electronic components electrically connected to the wiring pattern are mounted on at least one of the plurality of circuit boards. The first terminal electrically connected to the wiring pattern is provided on the lower surface of the lowermost one of the plurality of circuit boards. The second terminal electrically connected to the wiring pattern is provided so as to be exposed to the upper surface of any one of the plurality of circuit boards.

In this case, the second terminal is exposed to the upper surface of the circuit board. In a state where the module board is mounted on the external board through the first terminal, therefore, an inspection device can be connected to the second terminal. This allows an internal circuit of the electronic component and a signal of the electronic component to be inspected with the module board mounted on the external board. As a result, a defect in the electronic component within the module board can be reliably detected.

The second terminal is formed on any one of the plurality of circuit boards, which eliminates the need to provide a separate board for forming the second terminal. This can prevent the manufacturing cost of the module board from increasing.

Furthermore, the first terminal is formed on the lower surface of the circuit board, and the second terminal is formed on the upper surface of the circuit board. That is, the first and second terminals are respectively formed on the different surfaces of the circuit board. In this case, the size of the circuit board for forming the first and second terminals can be prevented from increasing. This allows the module board to be miniaturized.

(2)

At least one of the one or plurality of electronic components may be sealed.

In this case, the sealed electronic component is cut off from outside air. This causes the electronic component from being protected from external influences. As a result, the electronic component can be prevented from being damaged and degraded.

(3)

A space may be formed within the plurality of circuit boards, at least one of the one or plurality of electronic components may be arranged in the space, and the space may be sealed.

In this case, the electronic component is arranged in the sealed space, so that the electronic component is cut off from outside air. This causes the electronic component from being protected from external influences. As a result, the electronic component can be prevented from being damaged and degraded.

(4)

The second terminal may be electrically connected to the wiring pattern through a conductor penetrating at least one of the circuit boards.

In this case, the second terminal and the wiring pattern can be easily connected to each other. Further, respective capacitive components and inductive components of wiring between the second terminal and a plurality of wiring patterns can be reduced. This can prevent a waveform strain to be induced in an inspection signal inputted to the electronic component. Further, a part of the conductor can be used as the second terminal, so that the manufacturing cost of the module board can be reduced.

(5)

The second terminal may be provided in a partial region on the upper surface of the uppermost one of the plurality of circuit boards.

In this case, an inspection device can be easily connected to the second terminal from above the module board. This allows a defect in the electronic component within the module board to be easily detected.

(6)

The module board may further comprise a sealing layer formed on a region, excluding the partial region, on the upper surface of the uppermost circuit board.

In this case, the sealing layer cuts off the electronic component from outside air. This causes the electronic component to be protected from external influences. As a result, the electronic component can be prevented from being damaged and degraded.

(7)

The second terminal may be provided in a partial region on the upper surface of anyone of the circuit boards, excluding the uppermost circuit board, out of the plurality of circuit boards, and a space may be formed above the partial region.

In this case, an inspection device can be easily connected to the second terminal from the space. This allows a defect in the electronic component within the module board to be easily detected. Further, the circuit board positioned above the circuit board on which the second terminal is formed protects the second terminal from external influences. Therefore, the second terminal can be prevented from being damaged and degraded.

(8)

The other one or plurality of circuit boards positioned above the any one of the circuit board may have a concave (cut-out, notch, or incision) or an opening such that the second terminal is exposed.

In this case, an inspection device can be easily connected to the second terminal from above the module board through the concave or the opening. This allows a defect in the electronic component within the module board to be easily detected. Further, the second terminal is protected from external influences by being surrounded by an inner wall of the concave or the opening. Therefore, the second terminal can be prevented from being damaged and degraded.

(9)

The module board may further comprise an insulating layer provided between at least two of the plurality of circuit boards, the second terminal may be formed in the partial region on the upper surface of the circuit board below the insulating layer, and the insulating layer may have a concave or an opening such that the second terminal is exposed.

In this case, an inspection device can be easily connected to the second terminal through the concave or the opening. This allows a defect in the electronic component within the module board to be easily detected. Further, the second terminal is protected from external influences by being surrounded by an inner wall of the concave or the opening. Therefore, the second terminal can be prevented from being damaged and degraded.

(10)

The module board may further comprise grounding conductor layers respectively provided on the upper surface or the lower surface of the uppermost circuit board and the lower surface of the lowermost circuit board.

In this case, the grounding conductor layer can prevent high-frequency noises radiated from the electronic component and the wiring pattern from leaking out of the module board. This can prevent electronic equipment from being erroneously operated.

(11)

The first and second terminals may respectively comprise a plurality of first terminals and a plurality of second terminals, and the size of each of the plurality of second terminals may be smaller than the size of each of the plurality of first terminals.

In this case, a region where the second terminal is formed on the circuit board can be reduced, so that a region where an electronic component is to be mounted and a region where a wiring pattern is to be formed can be enlarged. This allows the packaging density of the electronic component on the module board to be improved and allows the module board to be miniaturized.

High-frequency noises can be prevented from being radiated to the outside of the module board from the second terminal by reducing the size of the second terminal. This can reliably prevent electronic equipment from being erroneously operated.

(12)

The pitch between the plurality of second terminals may be smaller than the pitch between the plurality of first terminals.

In this case, the region where the second terminal is formed on the circuit board can be reduced, so that a region where an electronic component is to be mounted and a region where a wiring pattern is to be formed can be enlarged. This allows the packaging density of the electronic component on the module board to be improved and allows the module board to be miniaturized.

(13)

The plurality of second terminals may be arranged in a matrix shape.

In this case, the region where the second terminal is formed on the circuit board can be reduced, so that a region where an electronic component is to be mounted and a region where a wiring pattern is to be formed can be enlarged. This allows the packaging density of the electronic component on the module board to be improved and allows the module board to be miniaturized.

(14)

The second terminal may be arranged in a region along at least one side of the any circuit board.

In this case, a region where an electronic component is to be mounted and a region where a wiring pattern is to be formed can be sufficiently ensured at the center of the circuit board. This allows the packaging density of the electronic component on the module board to be improved and allows the module board to be miniaturized.

(15)

The second terminal is arranged at the center of the any circuit board. In this case, the second terminal is protected from external influences. Therefore, the second terminal can be prevented from being damaged and degraded.

(16)

The one or plurality of electronic components may include first and second electronic components, the first and second electronic components may be electrically connected to each other by the wiring pattern formed on at least one of the circuit boards, out of the plurality of circuit boards, and the second terminal may be electrically connected to the wiring pattern for electrically connecting the first and second electronic components.

In this case, a signal, which is transferred between the first and second electronic components and is not outputted to the outside of the module board, can be inspected by connecting an inspection device to the second terminal. This allows the state of the electronic component within the module board to be specifically detected.

(17)

The one or plurality of electronic components and the wiring pattern may constitute a circuit for achieving a predetermined function, the first terminal may include a plurality of external terminals connected to the circuit, and the second terminal may include a plurality of inspection terminals for inspecting the circuit or any of the electronic components.

In this case, the circuit within the module board can be electrically connected to the external board through the external terminals. Further, the circuit and the electronic component can be inspected through the inspection terminals.

(18)

The one or plurality of electronic components may include a first electronic component and a plurality of second electronic components, the wiring pattern may include a first wiring part connected to the first electronic component and a plurality of second wiring parts branching off from the first wiring part and respectively connected to the plurality of second electronic components, and the plurality of inspection terminals may be connected to the plurality of second wiring parts.

In this case, a signal that is transferred between the first and second electronic components can be reliably inspected by connecting an inspection device to the inspection terminals.

(19)

The plurality of second wiring parts may have an equal length. In this case, a reflected wave can be prevented from being generated at the second terminal. This can prevent a waveform strain from being induced in the signal transferred between the first and second electronic components.

(20)

Each of the plurality of second electronic components may be a storage device.

In this case, the number of bits composing the signal processed by the first electronic component can be expanded depending on the number of storage devices electrically connected to the first electronic component. This allows the performance of the module board to be improved using a low-cost storage device with a small number of bits.

Effects of the Invention

According to the present invention, the second terminal is exposed to the upper surface of the circuit board. In a state where the module board is mounted on the external board through the first terminal, therefore, the inspection device can be connected to the second terminal. This makes it possible to inspect the internal circuit of the electronic component and the signal of the electronic component with the module board mounted on the external board. As a result, the defect in the electronic component within the module board can be reliably detected.

The second terminal is formed on any one of the plurality of circuit boards, which eliminates the need to provide a separate board for forming the second terminal. Consequently, the manufacturing cost of the module board can be prevented from increasing.

The first terminal is formed on the lower surface of the circuit board, and the second terminal is formed on the upper surface of the circuit board. That is, the first terminal and the second terminal are respectively formed on the different surfaces of the circuit board. Further, the size of the second terminal and the pitch between the second terminals can be made sufficiently smaller, respectively, than the size of the first terminal and the pitch between the first terminals. In this case, it is possible to prevent increase of the size of the circuit board due to forming of the first and second terminals. This allows the module board to be miniaturized.

In a case where the plurality of electronic components are contained, the plurality of second terminals are connected to the plurality of electronic components connected to the first electronic component by the plurality of second wiring parts having an equal length. The respective wiring lengths from the connection position to the plurality of second terminals are equal to one another. Consequently, a reflected wave can be prevented from being generated at the plurality of second terminals. This can prevent a waveform strain from being induced in a signal of the wiring pattern. Further, each of the electronic components and the wiring pattern between the electronic components are accommodated between the grounding conductor layers formed within the module board. Therefore, the radiation of high-frequency noises generated by each of the electronic components and the wiring pattern is inhibited by shielding. Further, the size of the second terminal can be sufficiently reduced. This can prevent the cost of inhibiting waveform strains and the cost of shielding in the module board from increasing.

BEST MODE FOR CARRYING OUT THE INVENTION

Figure 1:
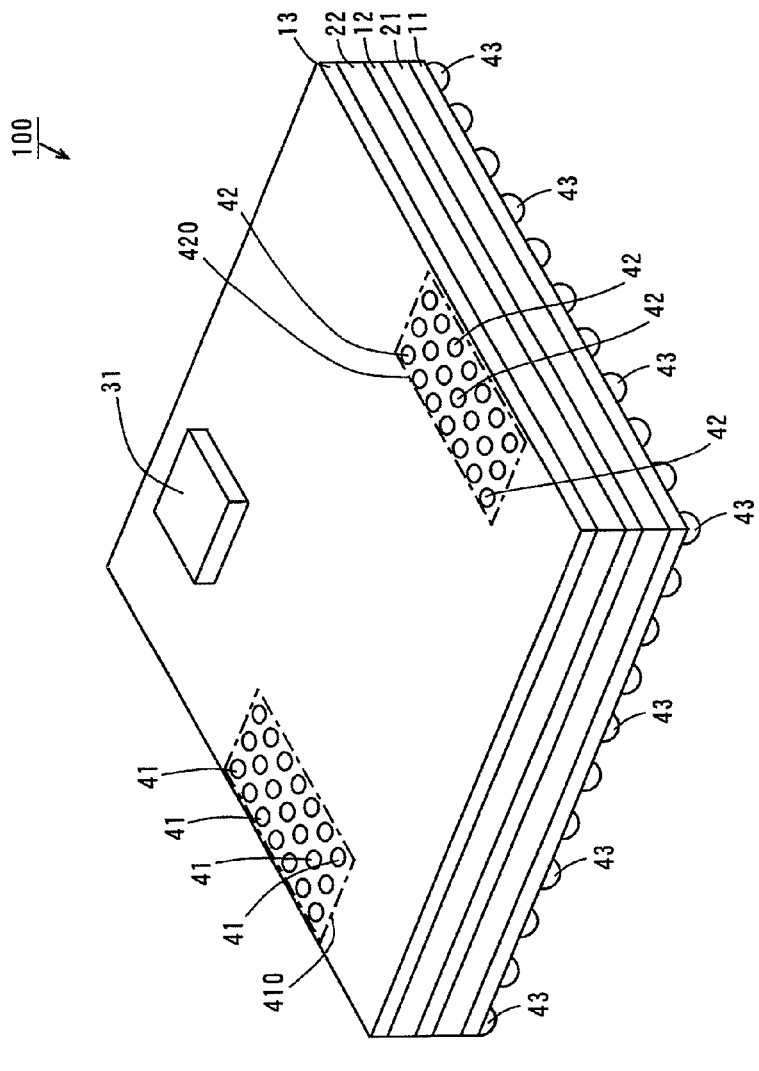
FIG. 1 is a perspective view showing the appearance of a module board according to a first embodiment.

Module boards according to the embodiments of the present invention will be described below while referring to the drawings.

(1) First Embodiment (a) Configuration

FIG. 1 is a perspective view showing the appearance of a module board according to a first embodiment. FIG. 1 is accompanied by arrows that respectively indicate X, Y, and Z directions perpendicular to one another for clarity of a positional relationship. The X and Y directions are perpendicular to each other within a horizontal plane, and the Z direction corresponds to a vertical direction. FIG. 2 and FIGS. 4 to 13, described later, are similarly accompanied by arrows that respectively indicate X, Y, and Z directions.

As shown in FIG. 1, a module board 100 according to the present embodiment has a configuration in which a first circuit board 11 (hereinafter abbreviated as a first board 11), a first composite sheet 21, a second circuit board 12 (hereinafter abbreviated as a second board 12), a second composite sheet 22, and a third circuit board 13 (hereinafter abbreviated as a third board 13) are laminated in this order. An IC (Integrated Circuit) 31 is mounted on the third board 13. Note that each of the first to third boards 11 to 13 may be a multilayer board or a single layer board. Usable as the first and second composite sheets 21 and 22 is an adhesive sheet including epoxy resin. For example, a prepreg can be used. Each of the first and second composite sheets assumes a role of an insulating layer.

A first inspection portion 410 and a second inspection portion 420 are respectively provided in predetermined regions along two sides in the Y direction on an upper surface of the third board 13. A plurality of inspection terminals 41 and a plurality of inspection terminals 42 are respectively arranged in a matrix shape in the first and second inspection portions 410 and 420.

The inspection terminals 41 and 42 are respectively electrically connected to electronic components such as LSIs mounted on the first and second boards 11 and 12 through wiring patterns, as described later. An example of the inspection terminals 41 and 42 is a land or a via. An inspection probe of an inspection device (not shown) is connected to the inspection terminals 41 and 42. The details will be described later.

A plurality of solder balls 43 are formed on a lower surface of the first board 11. The solder balls 43 are respectively electrically connected to the electronic components mounted on the first to third boards 11 to 13.

The module board 100 is mounted on an external board (not shown) by being soldered using the solder balls 43. This causes the external board and the electronic components mounted on the module board 100 to be electrically connected to each other. The module board 100 is mounted on the external board by a reflow soldering method, for example.

Note that the inspection terminals 41 and 42 need not be soldered by the reflow soldering method because they need not be connected to the external board. Therefore, each of the inspection terminals 41 and 42 may be of such a size that the inspection probe of the inspection device (not shown) can come into contact therewith. In this case, the size of each of the inspection terminals 41 and 42 can be sufficiently reduced, and the pitch between the inspection terminals 41 and the pitch between the inspection terminals 42 can be sufficiently reduced.

Consequently, the size of each of the inspection terminals 41 and 42 can be made sufficiently smaller than the size of the solder balls 43. Further, the pitch between the inspection terminals 41 and the pitch between the inspection terminals 42 can be made sufficiently smaller than the pitch between the solder balls 43. For example, the size of the solder balls 43 is approximately 650 μm, and the size of each of the inspection terminals 41 and 42 is approximately 100 μm. For example, the pitch between the solder balls 43 is 1 mm, and the pitch between the inspection terminals 41 is 150 μm.

The internal configuration of the module board 100 will be described in detail below.

Figure 2:
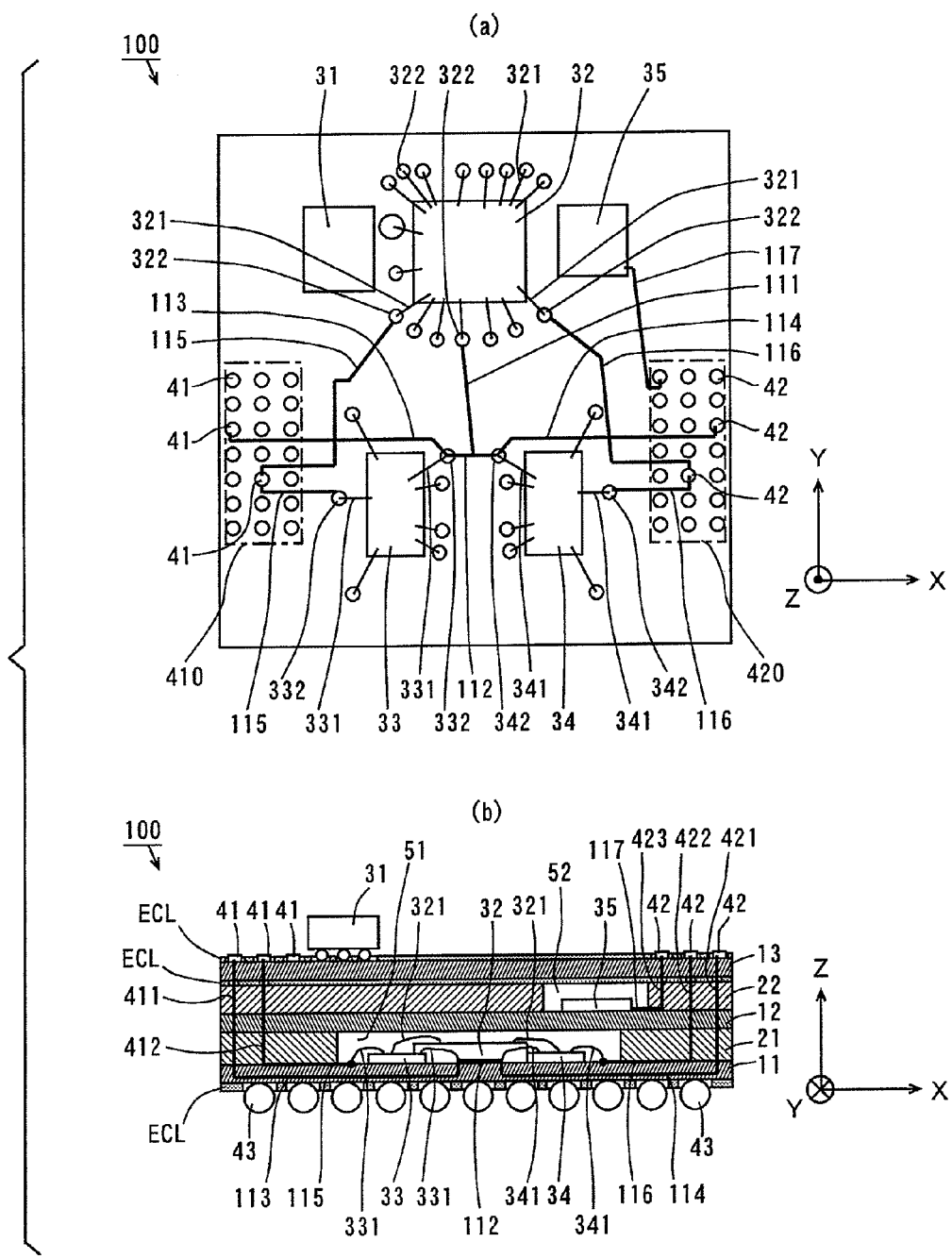
FIG. 2 is a diagram for explaining the internal configuration of the module board.

FIG. 2 is a diagram for explaining the internal configuration of the module board 100. FIG. 2 (*a*) is a diagram showing the positional relationship on an XY plane of a plurality of electronic components mounted on the module board 100, and FIG. 2 (*b*) is a cross-sectional view of the module board 100.

As shown in FIG. 2 (*b*), a space 51 vertically penetrating the first composite sheet 21 is formed at the center of the first composite sheet 21. An LSI (Large Scale Integrated Circuit) 32, a memory 33, and a memory 34 are mounted on the first board 11 within the space 51. Each of the memories 33 and 34 is a work memory that functions as a work area of the LSI 32. An example of the memories 33 and 34 is a DDR (Double Data Rate) memory. In this case, a signal having a high frequency of not less than 400 MHz can be transferred between the LSI 32 and the memories 33 and 34.

Furthermore, a space 52 vertically penetrating the second composite sheet 22 is formed in the second composite sheet 22. An LSI 35 is mounted on the second board 12 within the space 52.

Note that the space 51 is cut off from outside air by the first composite sheet 21 and the second board 12. That is, the LSI 32 and the memories 33 and 34 are mounted in the sealed space 51. Thus, the LSI 32 and the memories 33 and 34 can be protected from external influences, and can be prevented from being damaged and degraded. On the other hand, the space 52 is cut off from outside air by the second composite sheet 22 and the third board 13. That is, the LSI 35 is mounted in the sealed space 52. Thus, the LSI 35 can be protected from external influences, and can be prevented from being damaged and degraded. In the spaces 51 and 52, a sealing layer such as a thin-film mold may be further provided so as to cover the LSI 32 and the memories 33 and 34.

The LSI 32, the memories 33 and 34, and the LSI 35 are made to adhere on the first board 11 and the second board 12 through an adhesive sheet (not shown) having a thickness of several micrometer, for example. The LSI 32, the memories 33 and 34, and the LSI 35 are electrically connected to the first board 11 and the second board 12 by a wire bonding technology or a flip-chip technology, for example.

The respective heights on the first board 11 of the LSI 32, the memory 33, and the memory 34 and the respective heights on the second board 12 of the LSI 32, the memory 33, and the memory 34 can be kept low by using the wire bonding technology or the flip-chip technology. This allows the respective thicknesses of the first and second composite sheets 21 and 22 to be reduced and allows the module board 100 to be thinned.

In FIG. 2, the LSI 32 and the memories 33 and 34 are electrically connected to the wiring pattern on the first board 11 by the wire bonding technology, and the LSI 35 is electrically connected to the wiring pattern on the second board 12 by the flop-chip technology. Note that the IC 31 is mounted on the third board 13 so that the height thereof need not be kept low. Consequently, the IC 31 can be electrically connected to a wiring pattern (not shown) on the third board 13 by the reflow soldering method.

Note that usable as the LSI 32, the memories 33 and 34, and the LSI 35 is a bare die ground and diced to a predetermined size or a CSP (Chip Size Package), for example. It is preferable that the thickness of each of the first and second composite sheets 21 and 22 is larger than the thickness of the bare die or the CSP, for example, 50 μm to 800 μm.

As shown in FIG. 2 (b), grounding conductor layers ECL, which are not illustrated in FIG. 1, are respectively formed on the lower surface of the first board 11 and the upper surface and the lower surface of the third board 13.

The grounding conductor layer ECL is formed in a region, excluding regions where the solder balls 43 are respectively formed, on the lower surface of the first board 11. The grounding conductor layer ECL is formed in a region, excluding regions where the inspection terminals 41 and 42 are respectively formed, a region where the IC 31 is mounted, and a region where a wiring pattern (not shown) is formed, on the upper surface of the third board 13. The grounding conductor layer ECL is formed in a region, excluding regions where vias 411, 412, and 421 to 423 are respectively formed, on the lower surface of the third board 13. Note that it is preferable that the grounding conductor layers ECL are formed in the regions, which are as wide as possible, so as not to come into contact with the solder balls 43, the inspection terminals 41 and 42, the IC 31, the wiring pattern, and the vias 411, 412, and 421 to 423. The effect of the grounding conductor layers ECL will be described later.

Here, as shown in FIG. 2 (a), the LSI 32, the memories 33 and 34, the LSI 35, and the inspection terminals 41 and 42 are electrically connected to one another by wiring patterns 111 to 116 formed on the first board 11 and a wiring pattern 117 formed on the second board 12. Description is now made of wiring among the LSI 32, the memories 33 and 34, and the inspection terminals 41 and 42 will be described while further referring to FIG. 3.

Figure 3:
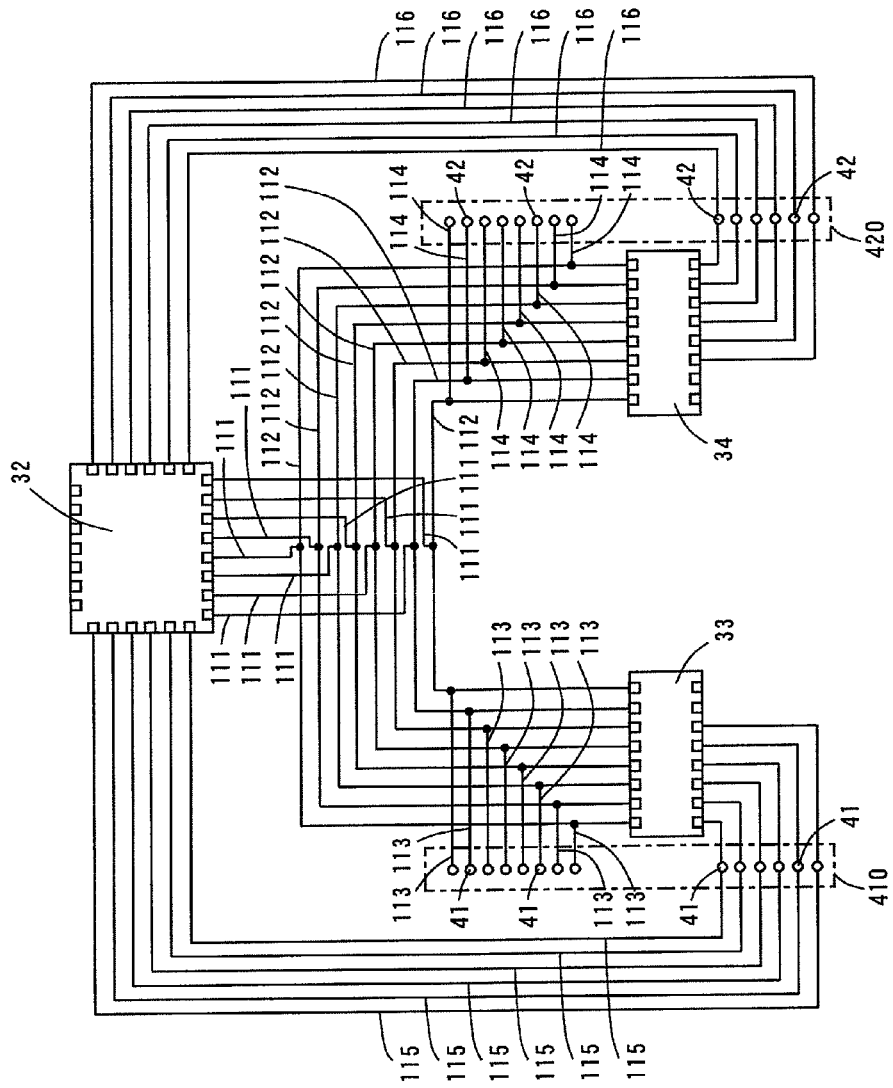
FIG. 3 is a diagram schematically showing wiring patterns formed on a first board.

FIG. 3 is a diagram schematically showing the wiring patterns 111 to 116 formed on the first board 11. Although the respective one wiring patterns 111 to 117 are typically illustrated in FIG. 2, each of the wiring patterns 111 to 117 actually comprises a plurality of wiring patterns. Similarly, although the respective one vias 411, 412, and 421 to 423 are typically illustrated in FIG. 2, each of the vias 411, 412, and 421 to 423 actually comprises a plurality of vias.

As shown in FIG. 3, one ends of the plurality of wiring patterns 111 are respectively electrically connected to a plurality of terminals of the LSI 32 through a plurality of bonding pads 322 (FIG. 2 (a)) and a plurality of wires 321 (FIG. 2 (a)). The other ends of the plurality of wiring patterns 111 are respectively connected to the centers of the plurality of wiring patterns 112.

One ends of the plurality of wiring patterns 112 are respectively electrically connected to a plurality of terminals of the memory 33 through bonding pads 332 (FIG. 2 (a)) and wires 331 (FIG. 2 (a)). The other ends of the plurality of wiring patterns 112 are respectively electrically connected to a plurality of terminals of the memory 34 through bonding pads 342 (FIG. 2 (a)) and wires 341 (FIG. 2 (a)).

As shown in FIG. 3, one ends of the plurality of wiring patterns 113 are respectively electrically connected to the plurality of inspection terminals 41 through the via 411 (FIG. 2 (b)) formed near one side in the Y direction of the module board 100 (FIG. 2 (b)). The other ends of the plurality of wiring patterns 113 are respectively connected to the plurality of wiring patterns 112. Thus, the wiring pattern 113 is stub wiring branching off from the wiring pattern 112. This causes the inspection terminals 41 to be electrically connected to the wiring patterns 111 and 112.

Furthermore, one ends of the plurality of wiring patterns 114 are respectively electrically connected to a plurality of inspection terminals 42 through the via 421 (FIG. 2 (b)) formed near the other side in the Y direction of the module board 100 (FIG. 2 (b)). The other ends of the plurality of wiring patterns 114 are respectively connected to the plurality of wiring patterns 112. Thus, the wiring pattern 114 is stub wiring branching off from the wiring pattern 112. This causes the inspection terminals 42 to be electrically connected to the wiring patterns 111 and 112.

One ends of the plurality of wiring patterns 115 are respectively electrically connected to the plurality of terminals of the LSI 32 through the bonding pads 322 (FIG. 2 (a)) and the wires 321 (FIG. 2 (a)). The other ends of the plurality of wiring patterns 115 are respectively electrically connected to the plurality of terminals of the memory 33 through the bonding pads 332 (FIG. 2 (a)) and the wires 331 (FIG. 2 (a)).

Furthermore, the plurality of wiring patterns 115 are respectively electrically connected to the plurality of inspection terminals 41 through the via 412 (FIG. 2 (b)) formed near one side in the Y direction of the module board 100 (FIG. 2 (b)). This causes the inspection terminals 41 to be electrically connected to the wiring patterns 115.

One ends of the plurality of wiring patterns 116 are respectively electrically connected to the plurality of terminals of the LSI 32 through the bonding pads 322 (FIG. 2 (a)) and the wires 321 (FIG. 2 (a)). The other ends of the plurality of wiring patterns 116 are respectively electrically connected to the plurality of terminals of the memory 34 through the bonding pads 342 (FIG. 2 (a)) and the wires 341 (FIG. 2 (a)).

Furthermore, the plurality of wiring patterns 116 are respectively electrically connected to the plurality of inspection terminals 42 through the via 422 (FIG. 2 (b)) formed near the other side in the Y direction of the module board 100 (FIG. 2 (b)). This causes the inspection terminals 42 to be electrically connected to the wiring patterns 116.

By the above-mentioned configuration, an address signal and a clock signal are transferred to the memories 33 and 34 from the LSI 32 through the wiring patterns 111 and 112.

Further, a data signal is transferred between the LSI 32 and the memories 33 and 34 through the wiring patterns 115 and 116.

Here, the wiring patterns 111, 112, 115, and 116 are functionally wiring that is only required for connecting the LSI 32 and the memories 33 and 34. That is, the wiring patterns 111, 112, 115, and 116 through which each of the signals is transferred are functionally sufficient for wiring for connecting the LSI 32 and the memories 33 and 34. The wiring patterns 111, 112, 115, and 116 are cut off from outside air by the first composite sheet 21 and the second board 12. That is, the LSI 32, the memories 33 and 34, and the wiring patterns 111, 112, 115, and 116 are sealed into the module board 100.

In order to inspect the waveform and pattern of each of the signals transferred to the memories 33 and 34 from the LSI 32, an inspection device (not shown) must be connected to the wiring patterns 111, 112, 115, and 116 sealed into the module board 100. In order to inspect respective internal circuits of the LSI 32 and the memories 33 and 34, inspection signals must be inputted to the LSI 32 and the memories 33 and 34 from outside the module board 100, respectively, to collate signals outputted from the LSI 132 and the memories 33 and 34 with their expected values.

In the present embodiment, therefore, the inspection terminals 41 are respectively electrically connected to the wiring patterns 111 and 112, as described in FIGS. 2 and 3. This causes the respective waveforms and patterns of the address signal and the clock signal transferred to the memory 33 from the LSI 32 to be inspected by connecting the inspection device (not shown) to the inspection terminals 41.

The inspection terminals 42 are respectively electrically connected to the wiring patterns 111 and 112. This causes the respective waveforms and patterns of the address signal and the clock signal transferred to the memory 34 from the LSI 32 to be inspected by connecting the inspection device (not shown) to the inspection terminals 42.

The inspection terminals 41 are respectively electrically connected to the wiring patterns 115. This causes the waveform and pattern of the data signal transferred between the LSI 32 and the memory 33 to be inspected by connecting the inspection device (not shown) to the inspection terminals 41.

The inspection terminals 42 are respectively electrically connected to the wiring patterns 116. This causes the waveform and pattern of the data signal transferred between the LSI 32 and the memory 34 to be inspected by connecting the inspection device (not shown) to the inspection terminals 42.

When the respective internal circuits of the LSI 32 and the memories 33 and 34 are inspected, inspection signals can be inputted thereto from the inspection terminals 41 and 42, respectively, to collate signals outputted from the inspection terminals 41 and 42 with their expected values.

As shown in FIG. 2, the LSI 35 is electrically connected to the inspection terminals 42 through the wiring patterns 117 and the via 423 (FIG. 2 (*b*)) in the module board 100. Consequently, it is possible to inspect an internal circuit of the LSI 35 and its signal, as in the LSI 32 and the memories 33 and 34, by connecting the inspection device (not shown) to the inspection terminals 42.

In the present embodiment, each of the common address signal and clock signal outputted from the LSI 32 through the wiring patterns 111 branches off in two directions by the wiring patterns 112, and signals obtained by the branching are respectively inputted to the memories 33 and 34.

In this case, when data signals each composed of six bits are respectively transferred to the memories 33 and 34 from the LSI 32 in FIG. 3, for example, the 6-bit data signals are respectively stored in storage areas designated by the common address signal in the memories 33 and 34. Consequently, the data signals composed of a total of 12 bits can be read and written out of and into the memories 33 and 34 using the common address signal and clock signal. That is, the number of bits composing the data signal processed by the LSI 32 can be expanded to two times. This allows the performance of the module board 100 to be improved using a low-cost memory.

In the present embodiment, the wiring pattern 113 and the wiring pattern 114 that are connected to the same wiring pattern 112 are formed to have an equal length. The wiring pattern 111 is connected to the position where the wiring pattern 112 is divided into two equal parts. Further, the via 411 and the via 421 are formed to have an equal length. Consequently, the wiring length from the connection position to the inspection terminal 41 and the wiring length from the connection position to the inspection terminal 42 become equal to each other.

In order to inspect signals to be respectively transferred to the wiring patterns 111 and 112, one inspection terminal is inherently sufficient for one set of wiring patterns 111 and 112 to be connected. When one stub wiring is pulled out of each of the wiring patterns 111 or each of the wiring patterns 112 and is connected to the inspection terminal, however, a reflected wave is generated at the inspection terminal, so that a waveform strain is induced in the signal.

In the present embodiment, therefore, the two wiring patterns 113 and 114 branching off from each of the wiring patterns 112 connect the two inspection terminals 41 and 42 for the set of wiring patterns 111 and 112 to be connected. The respective lengths of the wiring patterns 113 and 114 branching off from the same wiring pattern 112 are made equal to each other. Further, the wiring pattern 111 is connected to the position where the wiring pattern 112 is divided into two equal parts. This can prevent reflected waves from being respectively generated at the inspection terminals 41 and 42. As a result, waveform strains can be prevented from being respectively induced in the address signal and the clock signal.

Note that the wiring patterns 113 and 114 may branch off from not the wiring pattern 112 but the wiring pattern 111.

Furthermore, the number of memories connected to the LSI 32 is not limited to two. Three or more memories may be connected in parallel. In this case, it is possible to further expand the number of bits composing the data signal processed by the LSI 32.

In the configuration shown in FIG. 3, the wiring pattern connected to the LSI 32 branches off in two directions. When the number of memories is set to three or more, the wiring pattern connected to the LSI 32 is formed so as to branch off in the same number of directions as the number of memories. In this case, when inspection terminals are respectively connected to wiring patterns obtained by the branching, it is preferable that the wiring patterns are formed such that the respective wiring lengths from a branching point to the inspection terminals are equal to each other, as in the above-mentioned case. This can prevent a reflected wave from being generated at each of the inspection terminals.

As described in the foregoing, the grounding conductor layers ECL are respectively formed in the regions that are as wide as possible on the lower surface of the first board 11 and the upper surface and the lower surface of the third board 13. This allows the LSIs 32 and 35, the memories 33 and 34, and the wiring patterns 111 to 117 connected thereto to be accommodated between the grounding conductor layers ECL. In this case, the grounding conductor layers ECL can prevent high-frequency noises radiated from the LSIs 32 and 35, the memories 33 and 34, and the wiring patterns 111 to 117 from leaking out of the module board 100.

As described in the foregoing, the size of each of the inspection terminals 41 and 42 can be sufficiently reduced. In this case, the high-frequency noises can be prevented from being radiated to the outside of the module board 100 from the inspection terminals 41 and 42.

As a result of these, the high-frequency noises can be reliably prevented from being radiated from the module board 100. This can prevent electronic equipment from being erroneously operated.

(b) Effect

As described in the foregoing, in the present embodiment, the inspection terminals 41 and 42 are provided on the third board 13. In this case, even in a state where the module board 100 is mounted on the external board, it is possible to inspect the internal circuit of each of the electronic components (the LSIs 32 and 35 and the memories 33 and 34) mounted in the module board 100 and the signal of the electronic component using the inspection terminals 41 and 42. This allows a defect in each of the electronic components in the module board 100 to be reliably detected.

Signals, which are not inherently outputted to the outside of the module board 100, for example, the signals between the LSI 32 and the memories 33 and 34 (address signal, clock signal, and data signal), can be inspected. This allows the state of each of the electronic components in the module board 100 to be specifically inspected.

Furthermore, the inspection terminals 41 and 42 are electrically connected to the electronic components through the wiring patterns 111 to 117 and the vias 411, 412, and 421 to 423. In this case, there is no need to use wires for connecting the electronic components to the inspection terminals 41 and 42 in addition to the wires 321, 331, and 341 for connecting the electronic components to the wiring patterns 111 to 117.

Consequently, the respective lengths of the wires between each of the electronic components and the inspection terminals 41 and 42 can be reduced. In a case where the inspection signals are respectively inputted to the inspection terminals 41 and 42 from the inspection device, therefore, waveform strains can be prevented from being respectively induced in the inspection signals. As a result, the internal circuit of the electronic component can be accurately inspected.

Particularly when each of the electronic components is mounted on the first and second boards 11 and 12 by the flip-chip technology, there is no need to use a wire for mounting the electronic component. This allows impedance matching between each of the electronic components and the inspection terminals 41 and 42 to be more accurately provided.

The inspection terminals 41 and 42 are electrically connected to the LSI 32 and the memories 33 and 34 through the wiring patterns 111 to 114 and the vias 411 and 421. The wiring pattern 113 and the wiring pattern 114 that are connected to the same wiring pattern 112 are formed so as to have an equal length. Further, the wiring pattern 111 is connected to the position where the wiring pattern 112 is divided into two equal parts. Consequently, the wiring length from the connection position to the inspection terminals 41 and the wiring length from the connection position to the inspection terminals 42 become equal to each other. This can prevent reflected waves from being respectively generated at the inspection terminals 41 and 42. As a result, waveform strains can be prevented from being respectively induced in the address signal and the clock signal.

The inspection terminals 41 and 42 are provided on the third board 13 on which the IC 31 is mounted. That is, the inspection terminals 41 and 42 are provided on the board on which the electronic component is to be mounted, which eliminates the need to provide a separate board for providing the inspection terminals 41 and 42. Consequently, the manufacturing cost of the module board 100 can be prevented from increasing.

The respective wiring lengths between each of the electronic components and the inspection terminals 41 and 42 can be reduced by providing the inspection terminals 41 and 42 on the third board 13. This allows respective capacitive components and inductive components between each of the electronic components and the inspection terminals 41 and 42 to be reduced. As a result, a waveform strain can be reliably prevented from being induced in the inspection signal inputted to each of the electronic components.

The inspection terminals 41 and 42 are arranged on the upper surface on both sides of the third board 13. In this case, a region where an electronic component is to be mounted and a region where a wiring pattern is to be formed can be sufficiently ensured at the center of each of the first to third boards 11 to 13. This allows the packaging density of the electronic component in the module board 100 to be improved and allows the module board 100 to be miniaturized.

The size of each of the inspection terminals 41 and 42, the pitch between the inspection terminals 41, and the pitch between the inspection terminals 42 are sufficiently small. This allows a region where an electronic component is to be mounted and a region where a wiring pattern is to be formed to be further enlarged. As a result, it is possible to sufficiently improve the packaging density of the electronic component in the module board 100 as well as to sufficiently miniaturize the module board 100.

Each of the electronic components (the LSIs 32 and 35 and the memories 33 and 34) and the wiring patterns 111 to 117 between the electronic components can be accommodated between the grounding conductor layers ECL with a predetermined pattern. This can prevent the high-frequency noises radiated from each of the electronic components and the wiring patterns 111 to 117 from leaking out of the module board 100.

Furthermore, the size of each of the inspection terminals 41 and 42 can be sufficiently reduced. This can prevent the high-frequency noises from being radiated to the outside of the module board 100 from the inspection terminals 41 and 42.

As a result of these, the high-frequency noises can be prevented from being radiated from the module board 100 without taking special measures for removing the high-frequency noises. This can reliably prevent the electronic equipment from being erroneously operated.

As a result of the foregoing, it is possible to prevent the cost of inhibiting the waveform strains in the module board 100 and the cost of preventing the leakage of the high-frequency noises from increasing.

(c) Another Configuration

The arrangement shape of the inspection terminals 41 and 42 is not limited to that in the example shown in FIG. 1. For example, the plurality of inspection terminals 41 and 42 may be arranged along a peripheral edge of the third board 13. In this case, a region where an electronic component is to be mounted and a region where a wiring pattern is to be formed can be also sufficiently ensured at the center of each of first to third boards 11 to 13.

Although description was made of the case where only the LSI 35 is mounted on the second board 12 in FIG. 2, a plurality of electronic components may be mounted on the second board 12. For example, three electronic components may be mounted on the second board 12, as on the first board 11.

A circuit board may be used in place of each of the first and second composite sheets 21 and 22. In this case, wiring patterns can be formed on the circuit board, which allows more electronic components to be mounted on the module board 100.

In a case where the first and second composite sheets 21 and 22 are respectively replaced with circuit boards, the circuit boards may be formed integrally with the first board 11, the second board 12, or the third board 13.

(2) Second Embodiment

A module board according to a second embodiment differs from the module board according to the first embodiment (FIGS. 1 to 3) in the following points.

Figure 4:
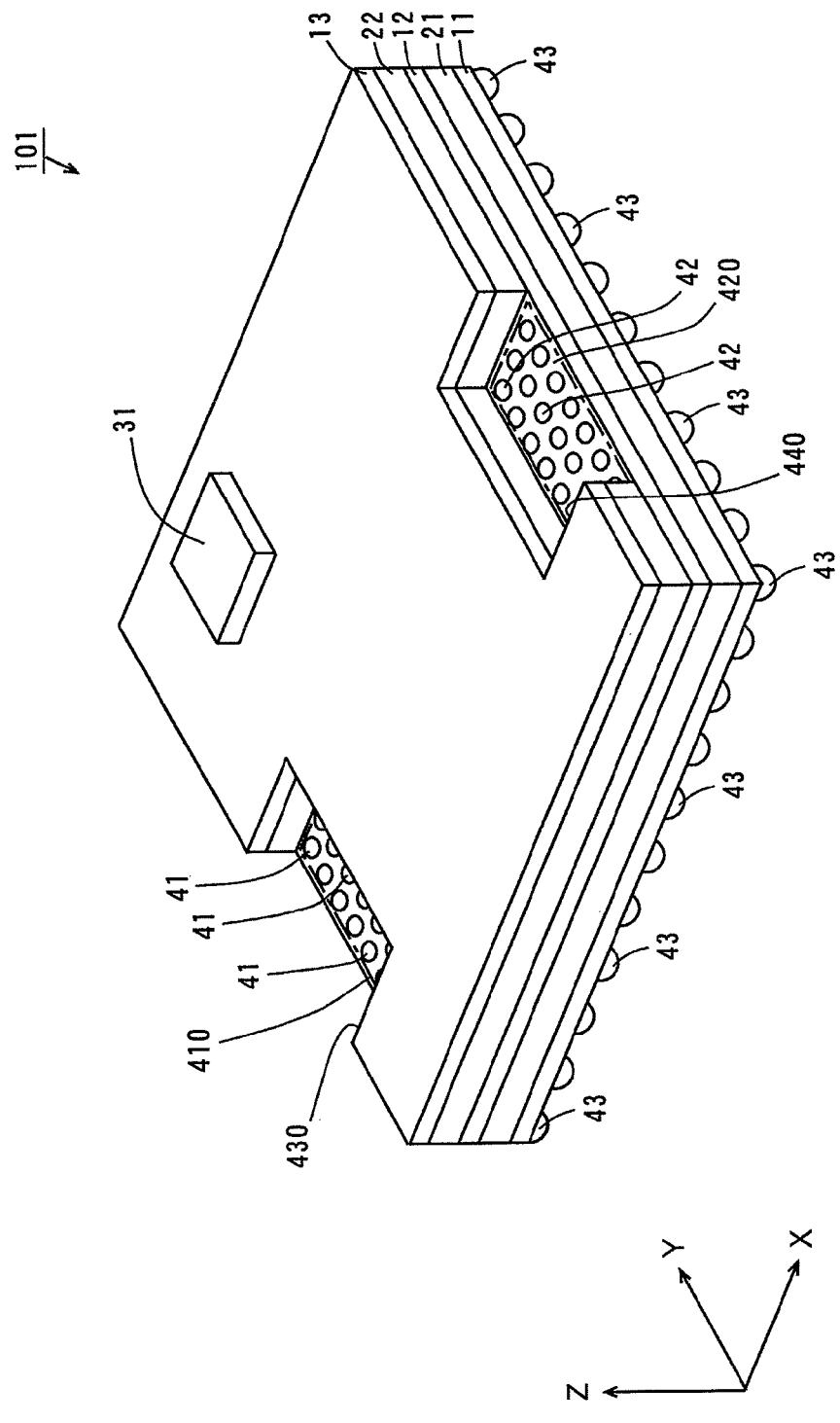
FIG. 4 is a perspective view showing the appearance of a module board according to a second embodiment.
Figure 5:
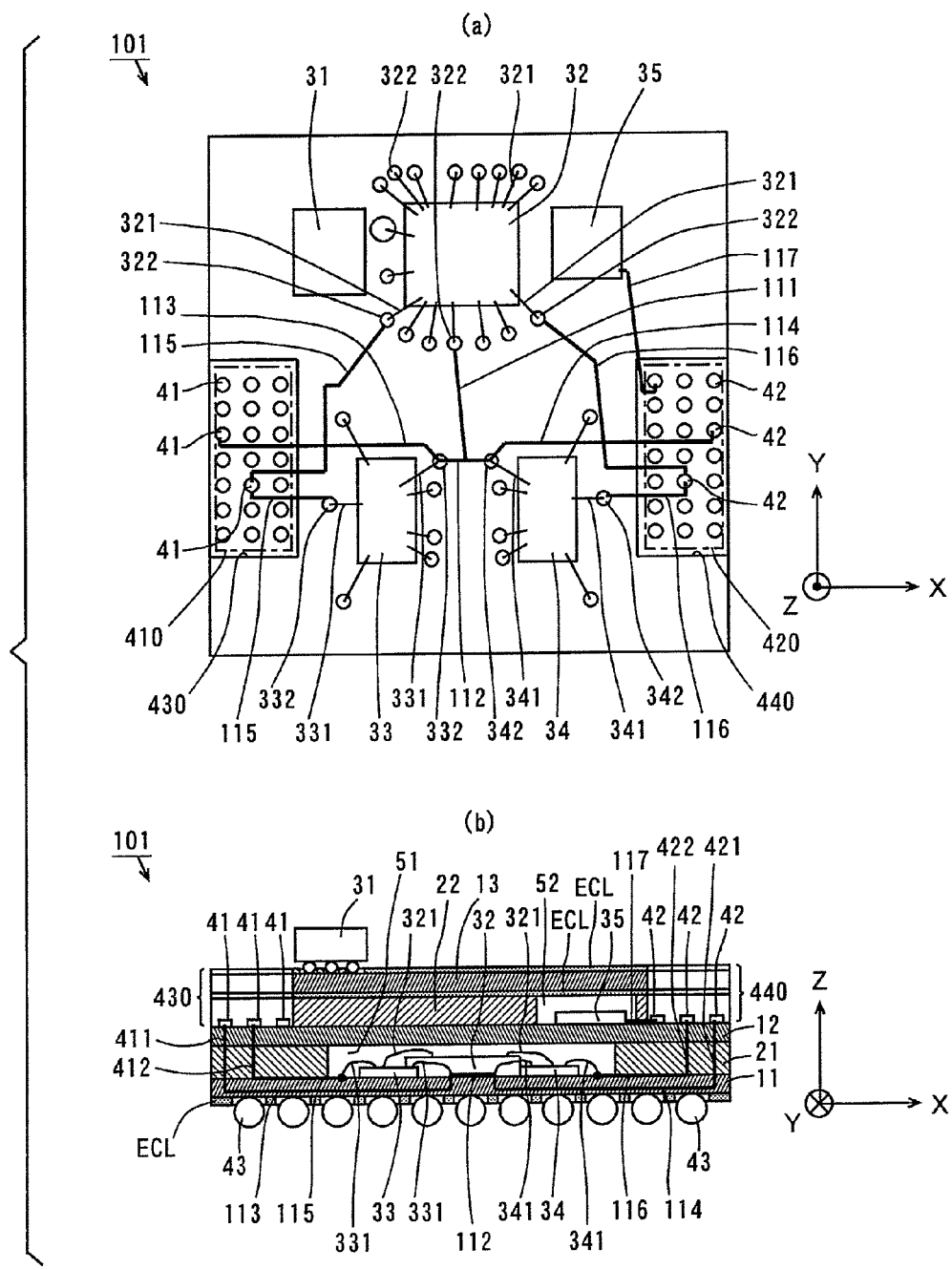
FIG. 5 is a diagram for explaining the internal configuration of the module board shown in FIG. 4.

FIG. 4 is a perspective view showing the appearance of the module board 101 according to the second embodiment. FIG. 5 is a diagram for explaining the internal configuration of the module board 101 shown in FIG. 4. FIG. 5 (*a*) is a diagram showing the positional relationship on an XY plane of a plurality of electronic components mounted on the module board 101, and FIG. 5 (*b*) is a cross-sectional view of the module board 101.

As shown in FIGS. 4 and 5, in the module board 101 according to the present embodiment, rectangular concaves (cut-outs, notches, or incisions) 430 and 440 are respectively formed in predetermined regions of a second composite sheet 22 and a third board 13 such that predetermined regions along two sides in the Y direction on an upper surface of a second board 12 are exposed. Further, a first inspection portion 410 and a second inspection portion 420 are respectively provided in regions, exposed within the concaves 430 and 440, on the upper surface of the second board 12.

Note that the concaves 430 and 440 may be formed by previously cutting away the respective predetermined regions of the second composite sheet 22 and the third board 13. Alternatively, the concaves 430 and 440 may be formed by cutting away the respective predetermined regions of the second composite sheet 22 and the third board 13 after the first to third boards 11 to 13 and the first and second composite sheets 21 and 22 are laminated.

In the present embodiment, inspection terminals 41 and 42 are provided on the second board 12, as shown in FIG. 5 (*b*). Therefore, vias for respectively connecting each of the electronic components and the inspection terminals 41 and 42 need not be formed on the second composite sheet 22 and the third board 13. This allows the manufacturing cost of the module board 101 to be reduced.

A wiring pattern 117 and the inspection terminal 42 on the second board 12 can be connected to each other on the second board 12. In this case, the wiring length between an LSI 35 and the inspection terminal 42 can be sufficiently reduced. This allows an inductive component and a capacitive component between the LSI 35 and the inspection terminal 42 to be sufficiently reduced. As a result, a waveform strain can be prevented from being induced in an inspection signal inputted to the LSI 35.

Since the inspection terminals 41 and 42 are provided on the second board 12, the respective wiring lengths from an LSI 32 and memories 33 and 34 to the inspection terminals 41 and 42 can be sufficiently reduced. This allows respective inductive components and capacitive components between the LSI 32 and the inspection terminals 41 and 42 and between the memories 33 and 34 and the inspection terminals 41 and 42 to be sufficiently reduced. As a result, waveform strains can be reliably prevented from being respectively induced in inspection signals inputted to the LSI 32 and the memories 33 and 34.

As shown in FIG. 4, the first and second inspection portions 410 and 420, excluding their one sides, are surrounded by the second composite sheet 22 and the third board 13. In this case, the inspection terminals 41 and 42 are protected by the second composite sheet 22 and the third board 13. Therefore, the inspection terminals 41 and 42 can be prevented from being damaged and degraded.

Note that the concave 430 and the concave 440 may be respectively formed in each of predetermined regions of the first composite sheet 21, the second board 12, the second composite sheet 22, and the third board 13 such that a predetermined region on an upper surface of the first board 11 is exposed.

In this case, the first inspection portion 410 and the second inspection portion 420 can be respectively provided in regions, exposed within the concaves 430 and 440, on the upper surface of the first board 11. In this configuration, the respective wiring lengths from the LSI 32 and the memories 33 and 34 to the inspection terminals 41 and 42 can be reliably reduced. Note that the LSI 35 and the inspection terminals 41 and 42 can be electrically connected to each other by forming vias in the second board 12 and the first composite sheet 21.

(3) Third Embodiment

A module board according to a third embodiment differs from the module board 100 according to the first embodiment (FIGS. 1 to 3) in the following points.

Figure 6:
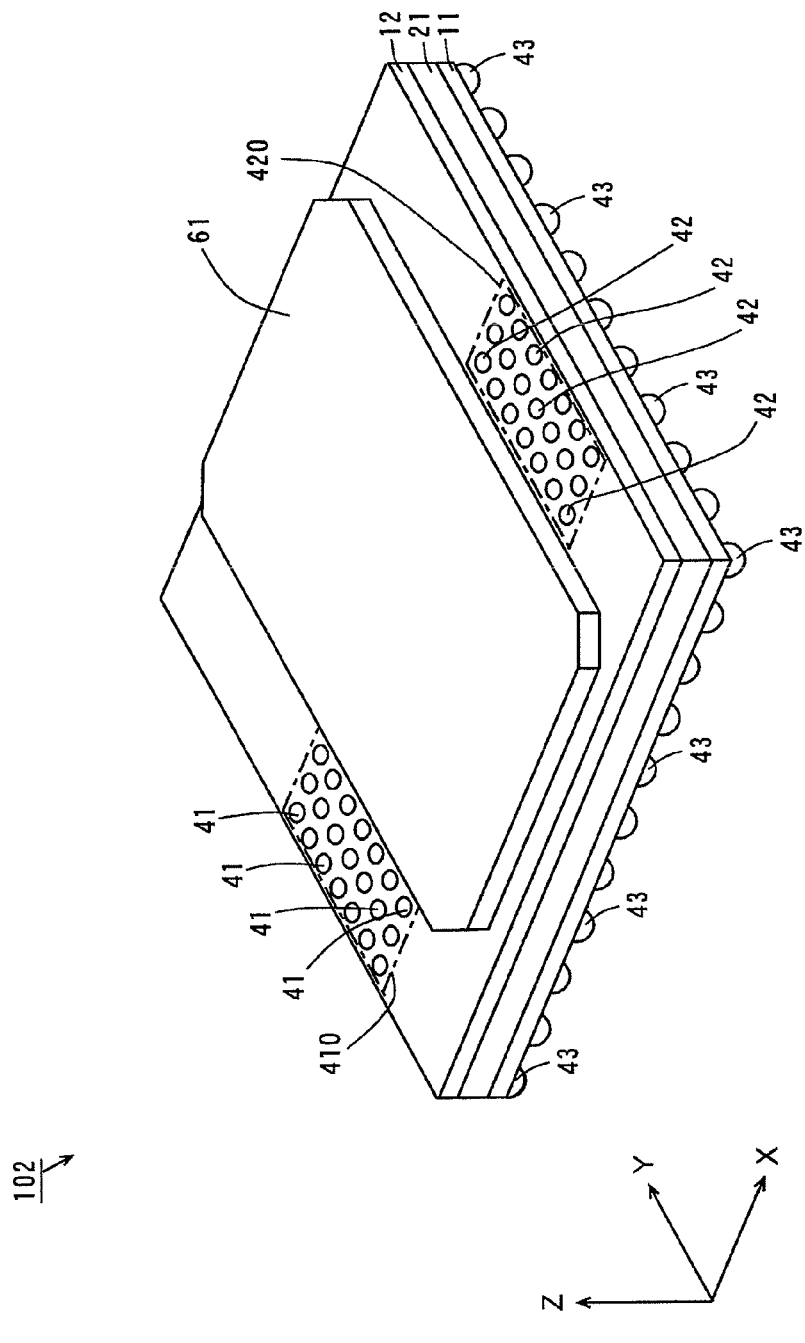
FIG. 6 is a perspective view showing the appearance of a module board according to a third embodiment.
Figure 7:
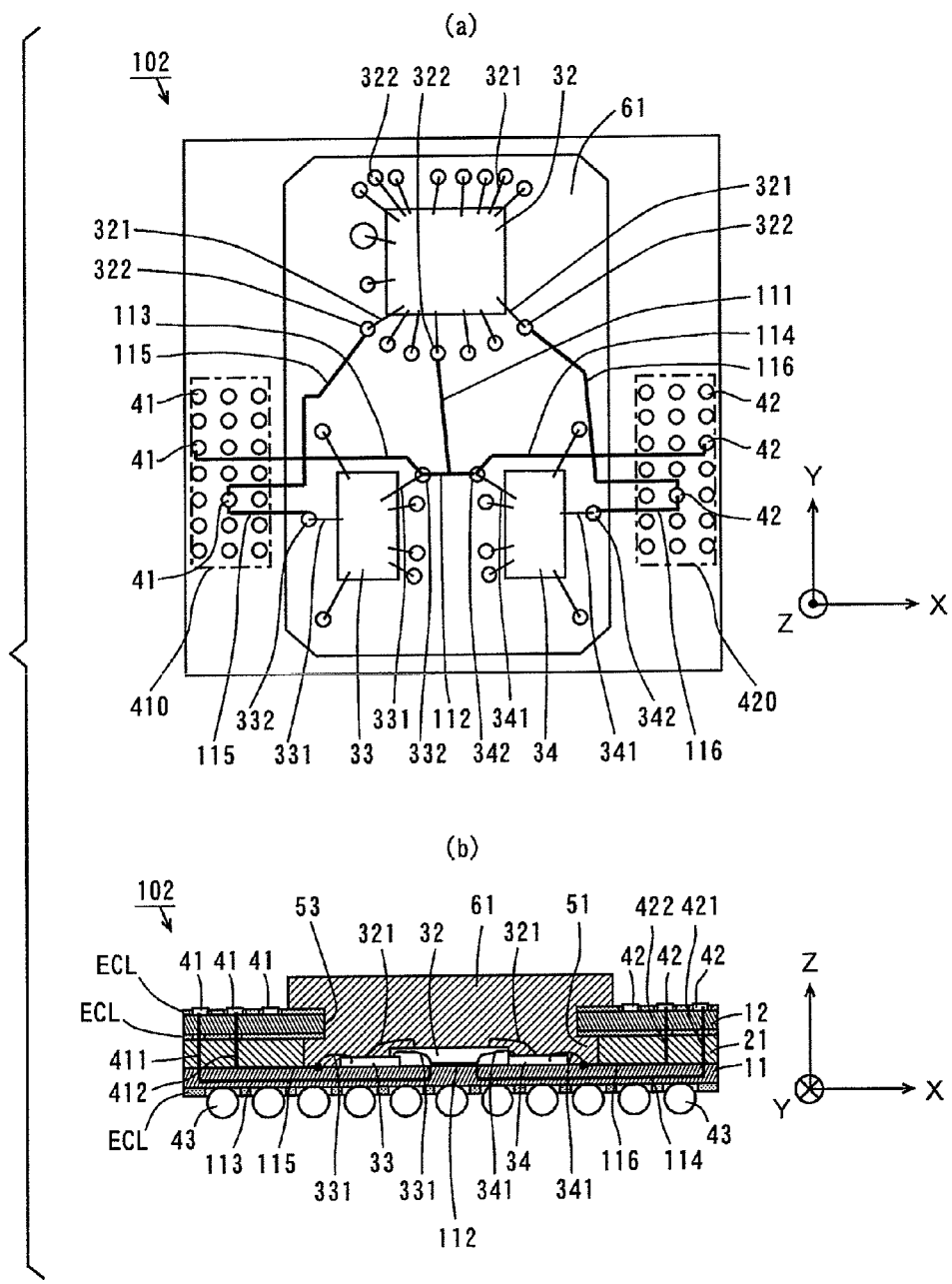
FIG. 7 is a diagram for explaining the internal configuration of the module board shown in FIG. 6.

FIG. 6 is a perspective view showing the appearance of the module board 102 according to the third embodiment. FIG. 7 is a diagram for explaining the internal configuration of the module board 102 shown in FIG. 6. FIG. 7 (*a*) is a diagram showing the positional relationship on an XY plane of a plurality of electronic components mounted on the module board 102, and FIG. 7 (*b*) is a cross-sectional view of the module board 102.

As shown in FIG. 6, in the module board 102 according to the present embodiment, a first board 11, a first composite sheet 21, and a second board 12 are laminated in this order. First and second inspection portions 410 and 420 are respectively provided in predetermined regions along two sides in the Y direction of the second board 12.

As shown in FIG. 7 (*b*), grounding conductor layers ECL are respectively formed on an upper surface and a lower surface of the second board 11, which is not illustrated in FIG. 6.

On an upper surface of the second board 12, a grounding conductor layer ECL is formed in a region excluding regions where the inspection terminals 41 and 42 are respectively formed. On a lower surface of the second board 12, a grounding conductor layer ECL is formed in a region excluding regions where vias 411, 412, and 421 to 423 are respectively formed.

Furthermore, as shown in FIG. 7 (*b*), a hole 53 is formed in a predetermined region at the center of the second board 12. As shown in FIGS. 6 and 7, a molded member 61 serving as a sealing layer is formed so as to seal a space 51 and the hole 53. This allows an LSI 32 and memories 33 and 34 to be protected from external influences, which can prevent them from being damaged and degraded. The molded member 61 is composed of a resin material, for example.

In the present embodiment, inspection terminals 41 and 42 are provided on the second board 12, as shown in FIG. 7 (*b*). Therefore, the respective wiring lengths from the LSI 32 and memories 33 and 34 to the inspection terminals 41 and 42 can be sufficiently reduced. This allows respective inductive components and capacitive components between the LSI 32 and the inspection terminals 41 and 42 and between the memories 33 and 34 and the inspection terminals 41 and 42 to be sufficiently reduced. As a result, waveform strains can be reliably prevented from being respectively induced in inspection signals inputted to the LSI 32 and the memories 33 and 34.

The inspection terminals 41 and 42 are provided on the second board 12 on which an electronic component can be mounted. That is, the inspection terminals 41 and 42 are provided on a circuit board on which an electronic component is to be mounted, which eliminates the need to provide a separate circuit board for providing the inspection terminals 41 and 42. Consequently, the manufacturing cost of the module board 102 can be prevented from increasing.

Note that the first composite sheet 21 may be replaced with a circuit board. In this case, a wiring pattern can be formed on the circuit board, more electronic components can be mounted on the module board 102.

When the first composite sheet 21 is replaced with a circuit board, the circuit board may be formed integrally with the first board 11 or the second board 12.

(4) Fourth Embodiment

A module board according to a fourth embodiment differs from the module board 102 according to the third embodiment (FIGS. 6 and 7) in the following points.

Figure 8:
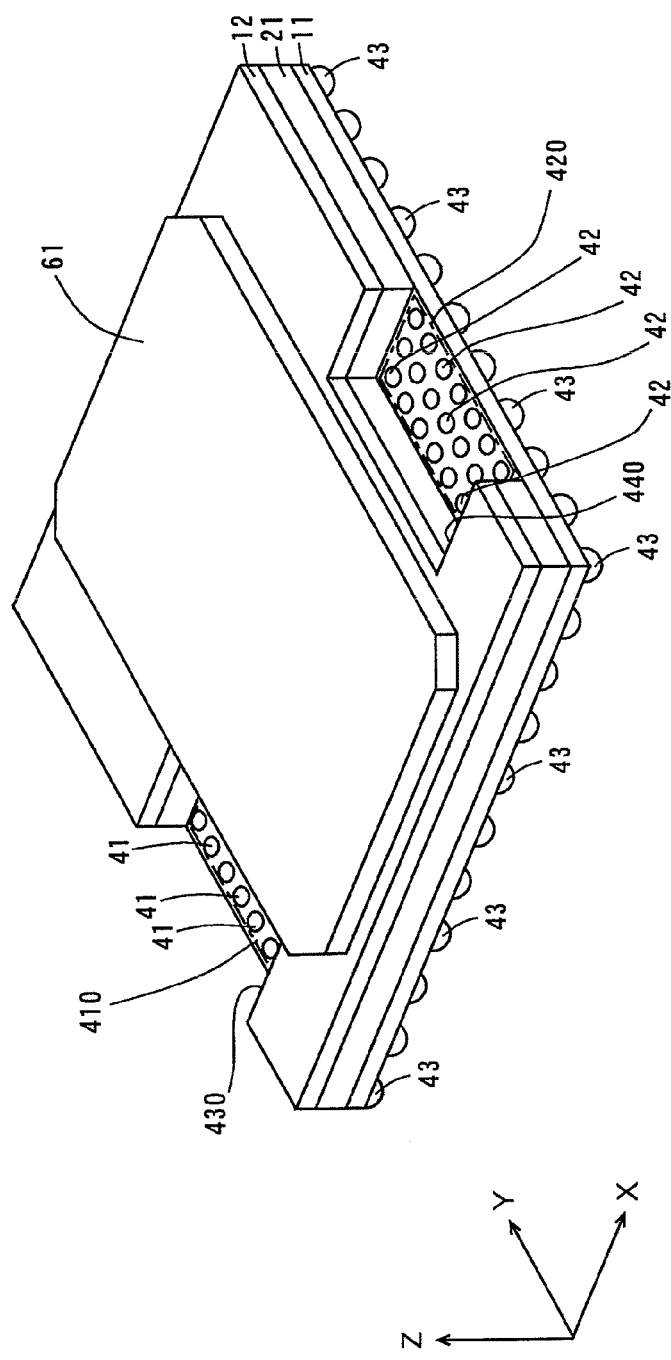
FIG. 8 is a perspective view showing the appearance of a module board according to a fourth embodiment.
Figure 9:
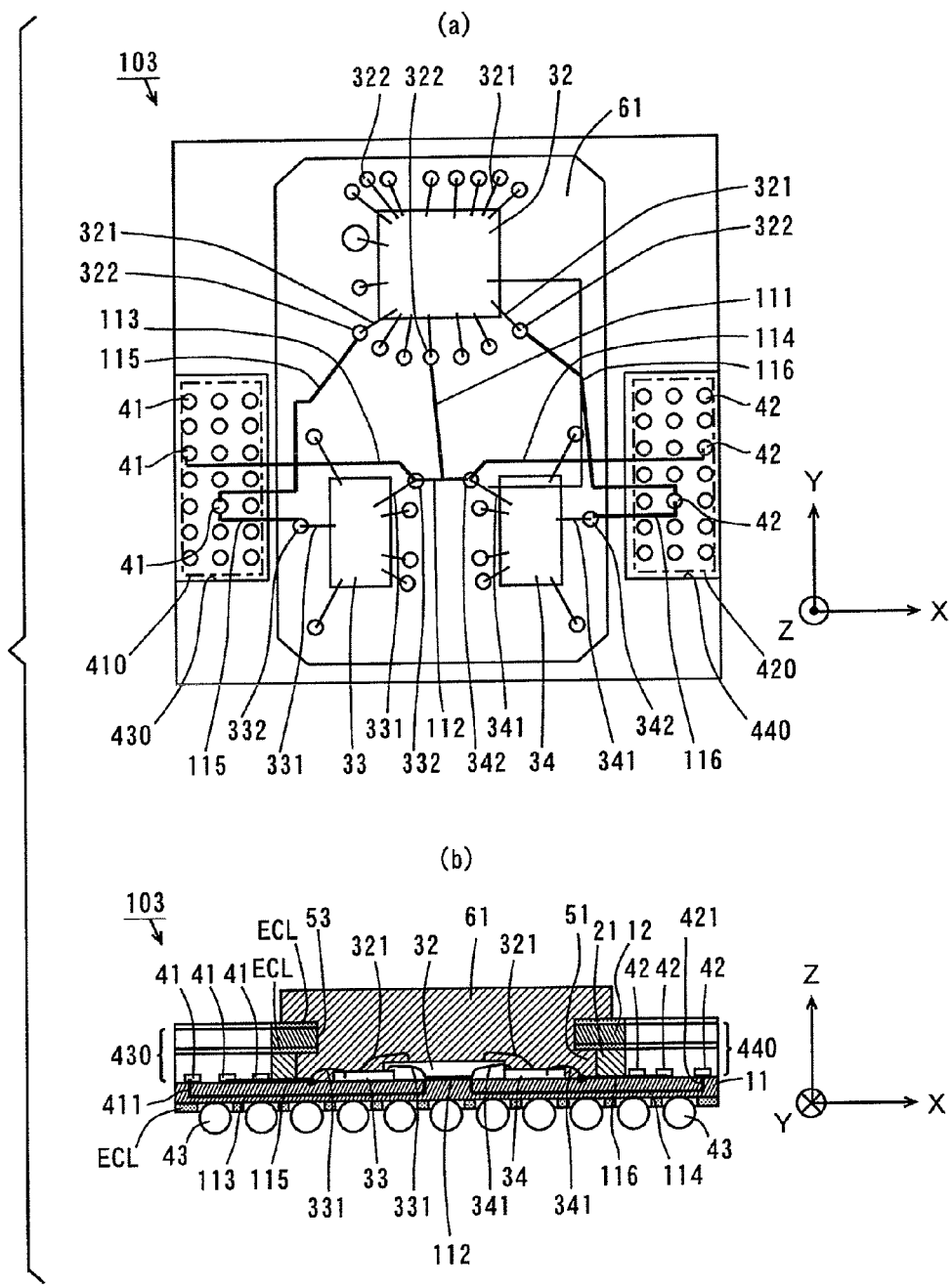
FIG. 9 is a diagram for explaining the internal configuration of the module board shown in FIG. 8.

FIG. 8 is a perspective view showing the appearance of the module board 103 according to the fourth embodiment. FIG. 9 is a diagram for explaining the internal configuration of the module board 103 shown in FIG. 8. FIG. 9 (*a*) is a diagram showing the positional relationship on an XY plane of a plurality of electronic components mounted on the module board 103, and FIG. 9 (*b*) is a cross-sectional view of the module board 103.

As shown in FIGS. 8 and 9, in the module board 103 according to the present embodiment, rectangular concaves 430 and 440 are respectively formed in predetermined regions of a first composite sheet 21 and a second board 12 such that predetermined regions along two sides in the Y direction on an upper surface of a first board 11 are exposed. Further, a first inspection portion 410 and a second inspection portion 420 are respectively provided in regions, exposed within the concaves 430 and 440, on the upper surface of the first board 11.

In the present embodiment, inspection terminals 41 and 42 are provided on the first board 11, as shown in FIG. 9 (*b*). Therefore, vias for respectively electrically connecting each of the electronic components and the inspection terminals 41 and 42 need not be formed on the first composite sheet 21 and the second board 12. This allows the manufacturing cost of the module board 103 to be reduced.

Since the inspection terminals 41 and 42 are provided on the first board 11, the respective wiring lengths from an LSI 32 and memories 33 and 34 to the inspection terminals 41 and 42 can be sufficiently reduced. This allows respective inductive components and capacitive components between the LSI 32 and the inspection terminals 41 and 42 and between the memories 33 and 34 and the inspection terminals 41 and 42 to be sufficiently reduced. As a result, waveform strains can be reliably prevented from being respectively induced in inspection signals inputted to the LSI 32 and the memories 33 and 34.

The first and second inspection portions 410 and 420, excluding their one sides, are surrounded by the first composite sheet 21 and the second board 12. In this case, the inspection terminals 41 and 42 are protected by the first composite sheet 21 and the second board 12. Therefore, the inspection terminals 41 and 42 can be prevented from being damaged and degraded.

(5) Fifth Embodiment

A module board according to a fifth embodiment differs from the module board 100 according to the first embodiment (FIGS. 1 to 3) in the following points.

Figure 10:
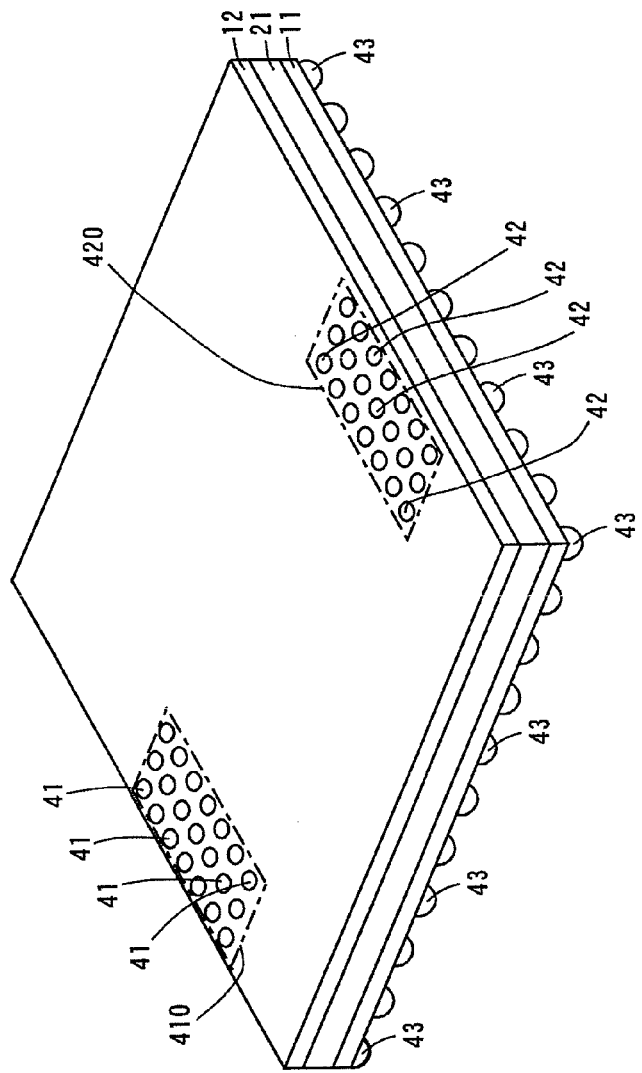
FIG. 10 is a perspective view showing the appearance of a module board according to a fifth embodiment.

FIG. 10 is a perspective view showing the appearance of the module board according to the fifth embodiment.

As shown in FIG. 10, the module board 104 according to the present embodiment has a configuration in which a first board 11, a first composite sheet 21, and a second board 12 are laminated in this order. First and second inspection portions 410 and 420 are respectively provided in predetermined regions along two sides in the Y direction of the second board 12. Further, an LSI 32 and memories 33 and 34 are mounted, as in FIG. 2 (*b*), on the first board 11.

Since inspection terminals 41 and 42 are provided on the second board 12 in the present embodiment, the respective wiring lengths from the LSI 32 and the memories 33 and 34 to the inspection terminals 41 and 42 can be sufficiently reduced. This allows respective inductive components and capacitive components between the LSI 32 the inspection terminals 41 and 42 and between and the memories 33 and 34 and the inspection terminals 41 and 42 to be sufficiently reduced. As a result, waveform strains can be reliably prevented from being respectively induced in inspection signals inputted to the LSI 32 and the memories 33 and 34.

(6) Sixth Embodiment

A module board according to a sixth embodiment differs from the module board 104 according to the fifth embodiment (FIG. 10) in the following points.

Figure 11:
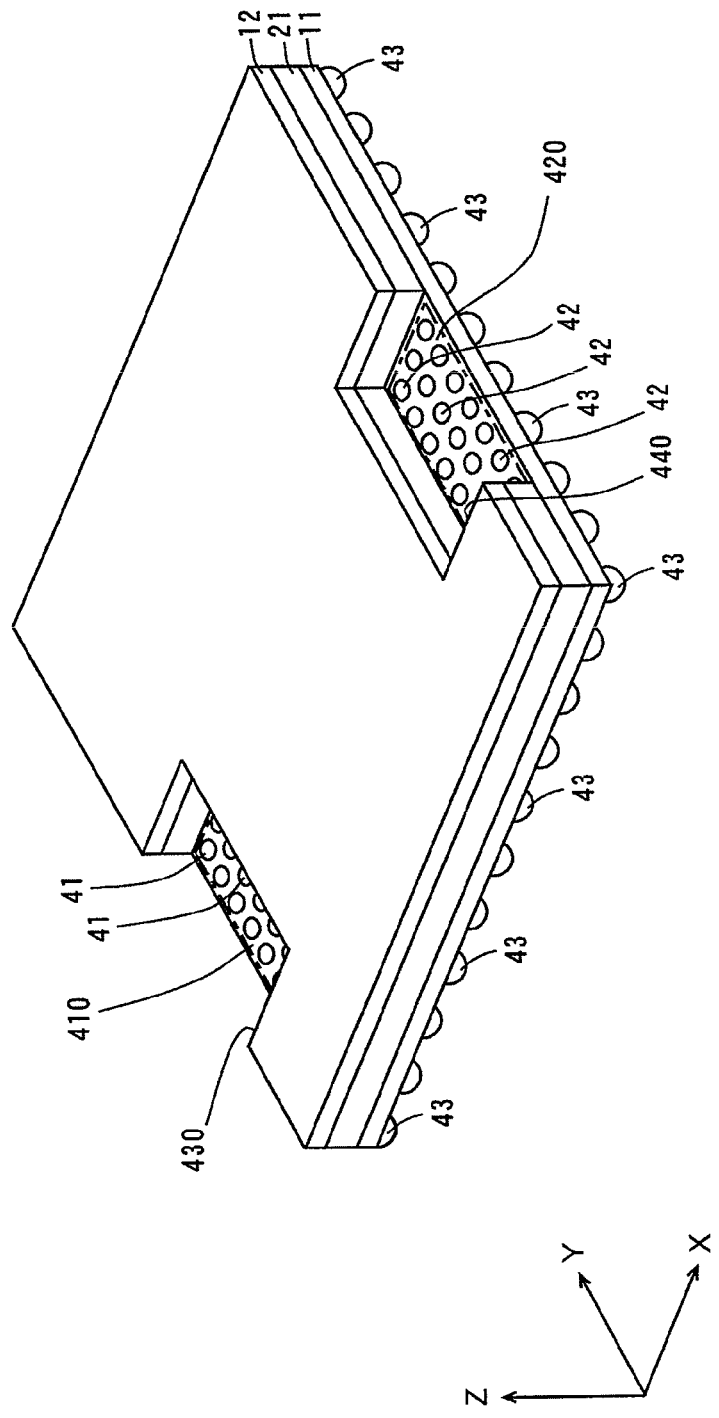
FIG. 11 is a perspective view showing the appearance of a module board according to a sixth embodiment.

FIG. 11 is a perspective view showing the appearance of the module board according to the sixth embodiment.

As shown in FIG. 11, in the module board 105 according to the present embodiment, rectangular concaves 430 and 440 are respectively formed in predetermined regions of a first composite sheet 21 and a second board 12 such that predetermined regions along two sides in the Y direction on an upper surface of a first board 11 are exposed. Further, a first inspection portion 410 and a second inspection portion 420 are respectively provided in regions, exposed within the concaves 430 and 440, on the upper surface of the first board 11.

In the present embodiment, inspection terminals 41 and 42 are provided on the first board 11. Therefore, vias for respectively electrically connecting each of electronic components and the inspection terminals 41 and 42 need not be formed in the first composite sheet 21 and the second board 12. This allows the manufacturing cost of the module board 105 to be reduced.

Since the inspection terminals 41 and 42 are provided on the first board 11, the respective wiring lengths from an LSI 32 and memories 33 and 34 to the inspection terminals 41 and 42 can be sufficiently reduced. This allows respective inductive components and capacitive components between the LSI 32 and the inspection terminals 41 and 42 and between the memories 33 and 34 and the inspection terminals 41 and 42 to be sufficiently reduced. As a result, waveform strains can be reliably prevented from being respectively induced in inspection signals inputted to the LSI 32 and the memories 33 and 34.

The first and second inspection portions 410 and 420, excluding their one sides, are surrounded by the first composite sheet 21 and the second board 12. In this case, the inspection terminals 41 and 42 are protected by the first composite sheet 21 and the second board 12. Therefore, the inspection terminals 41 and 42 can be prevented from being damaged and degraded.

(7) Seventh Embodiment

A module board according to a seventh embodiment differs from the module board 105 according to the sixth embodiment (FIG. 11) in the following points.

Figure 12:
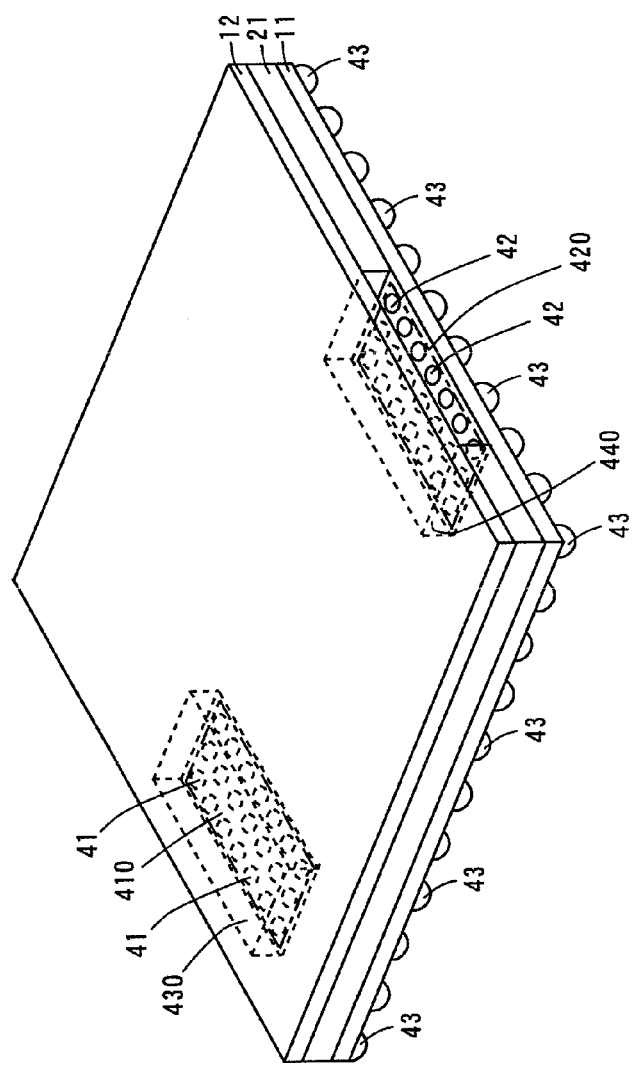
FIG. 12 is a perspective view showing the appearance of a module board according to a seventh embodiment.

FIG. 12 is a perspective view showing the appearance of the module board according to the seventh embodiment.

As shown in FIG. 12, in the module board 106 according to the present embodiment, rectangular concaves 430 and 440 are respectively formed in predetermined regions of a first composite sheet 21 such that predetermined regions along two sides in the Y direction on an upper surface of a first board 11 are exposed. Further, a first inspection portion 410 and a second inspection portion 420 are respectively provided in regions, exposed within the concaves 430 and 440, on the upper surface of the first board 11.

In this case, respective upper surfaces of the first and second inspection portions 410 and 420 are protected by a second board 12. Therefore, inspection terminals 41 and 42 can be reliably prevented from being damaged and degraded.

Since no concave is formed in the second board 12, a region where an electronic component is to be mounted and a region where a wiring pattern is to be formed can be sufficiently ensured on the second board 12.

(8) Eighth Embodiment

A module board according to an eighth embodiment differs from the module board 104 according to the fifth embodiment (FIG. 10) in the following points.

Figure 13:
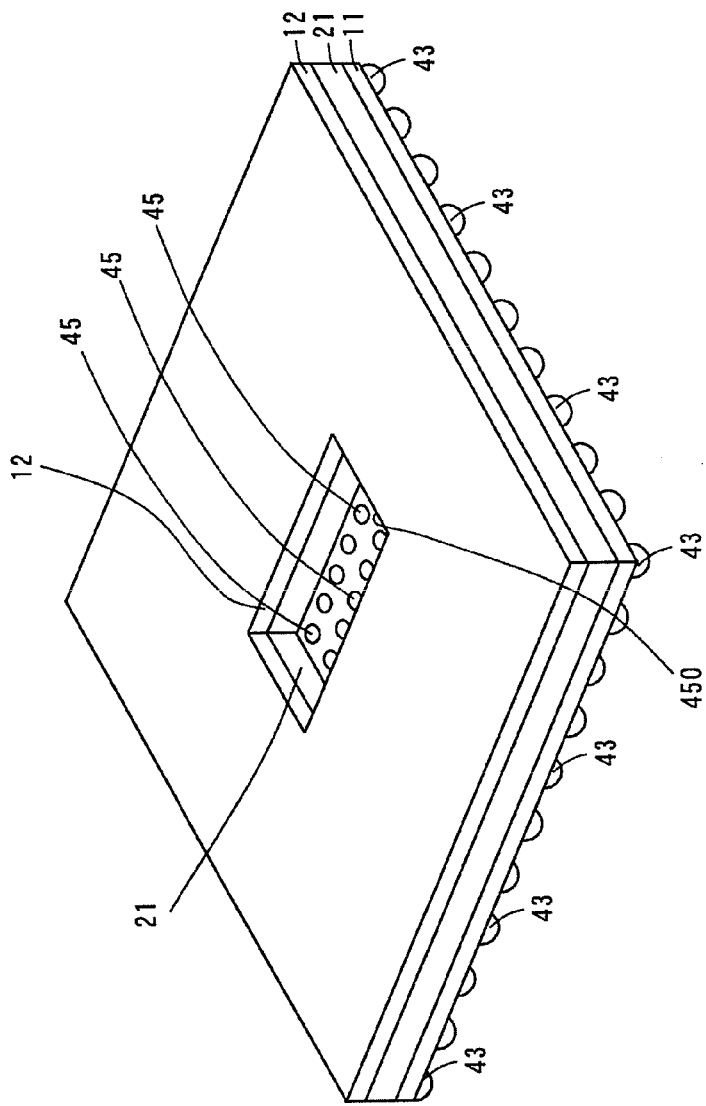
FIG. 13 is a perspective view showing the appearance of a module board according to an eighth embodiment.
Figure 13:
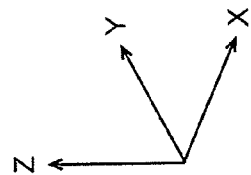

FIG. 13 is a perspective view showing the appearance of the module board according to the eighth embodiment.

As shown in FIG. 13, in the module board 107 according to the present embodiment, a rectangular opening 450 is formed at the respective centers of a first composite sheet 21 and a second board 12 such that a predetermined region on an upper surface of a first board 11 is exposed. Further, a plurality of inspection terminals 45 are arranged in a matrix shape in a region on the upper surface of the first board 11 exposed within the opening 450. Note that the inspection terminals 45 are connected to each of electronic components, as in the above-mentioned embodiments.

In the present embodiment, the inspection terminals 45 are provided on the first board 11. Therefore, a via for electrically connecting each of the electronic components and the inspection terminals 45 need not be formed in the first composite sheet 21 and the second board 12. This allows the manufacturing cost of the module board 107 to be reduced.

Since the inspection terminals 45 are provided on the first board 11, the respective wiring lengths from an LSI 32 and memories 33 and 34 to the inspection terminals 45 can be sufficiently reduced. This allows respective inductive components and capacitive components between the LSI 32 and the inspection terminals 41 and 42 and between the memories 33 and 34 and the inspection terminals 45 to be sufficiently reduced. As a result, waveform strains can be reliably prevented from being respectively induced in inspection signals inputted to the LSI 32 and the memories 33 and 34.

The inspection terminals 45 are surrounded by the first composite sheet 21 and the second board 12. In this case, the inspection terminals 45 are protected by the first composite sheet 21 and the second board 12. Therefore, the inspection terminals 45 can be prevented from being damaged and degraded.

(9) Another Embodiment

Although description was made of a case where the LSI 32 and the memories 33 and 34 are electrically connected to each other on the first board 11 in the above-mentioned embodiments, a plurality of electronic components mounted on the first board 11 may be respectively mounted in an electrically independent manner.

Figure 14:
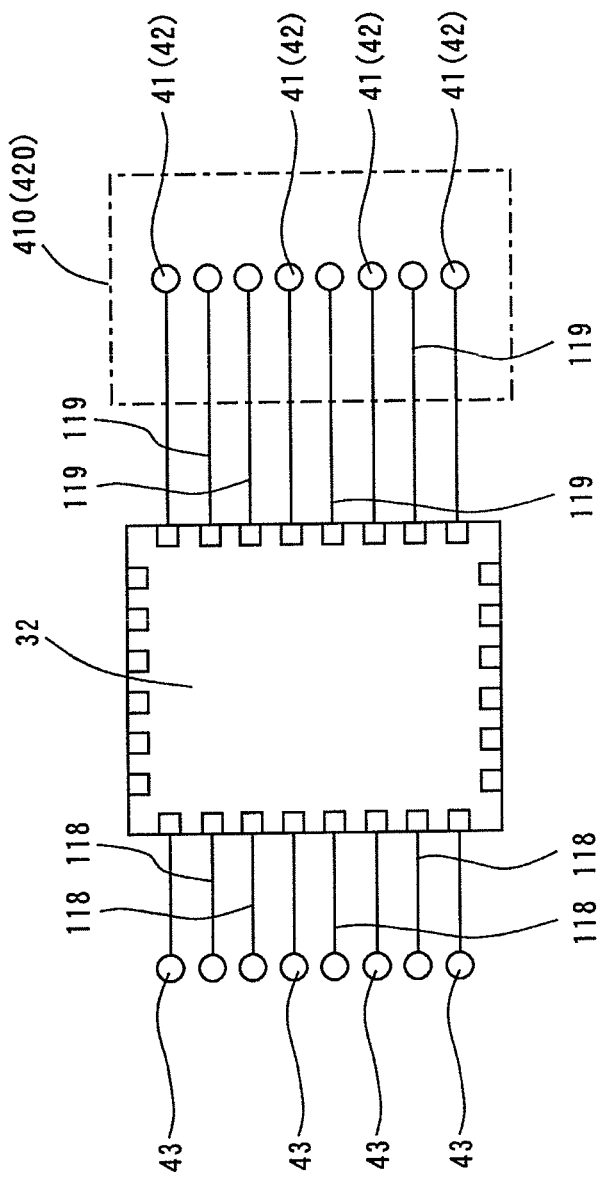
FIG. 14 is a diagram showing an example of the relationship between an LSI and inspection terminals.

FIG. 14 is a diagram showing an example of the relationship between an LSI 32 and inspection terminals 41 or 42 in a case where the LSI 32 is mounted on the first board 11 in an electrically independent manner from other electronic components.

In FIG. 14, a plurality of terminals of the LSI 32 and a plurality of solder balls 43 are electrically connected, respectively, by a plurality of wiring patterns 118. This causes the LSI 32 and a circuit of an external board to be electrically connected to each other. Also in the first embodiment, the LSI 32 and the solder balls 43 are electrically connected, as in FIG. 14, which is not illustrated in FIG. 3.

The plurality of terminals of the LSI 32 and the plurality of inspection terminals 41 or 42 are electrically connected, respectively, by a plurality of wiring patterns 119. Consequently, it is possible to inspect an internal circuit of the LSI 32 and its signal, as in the above-mentioned embodiments, by using the inspection terminals 41 or 42.

Figure 15:
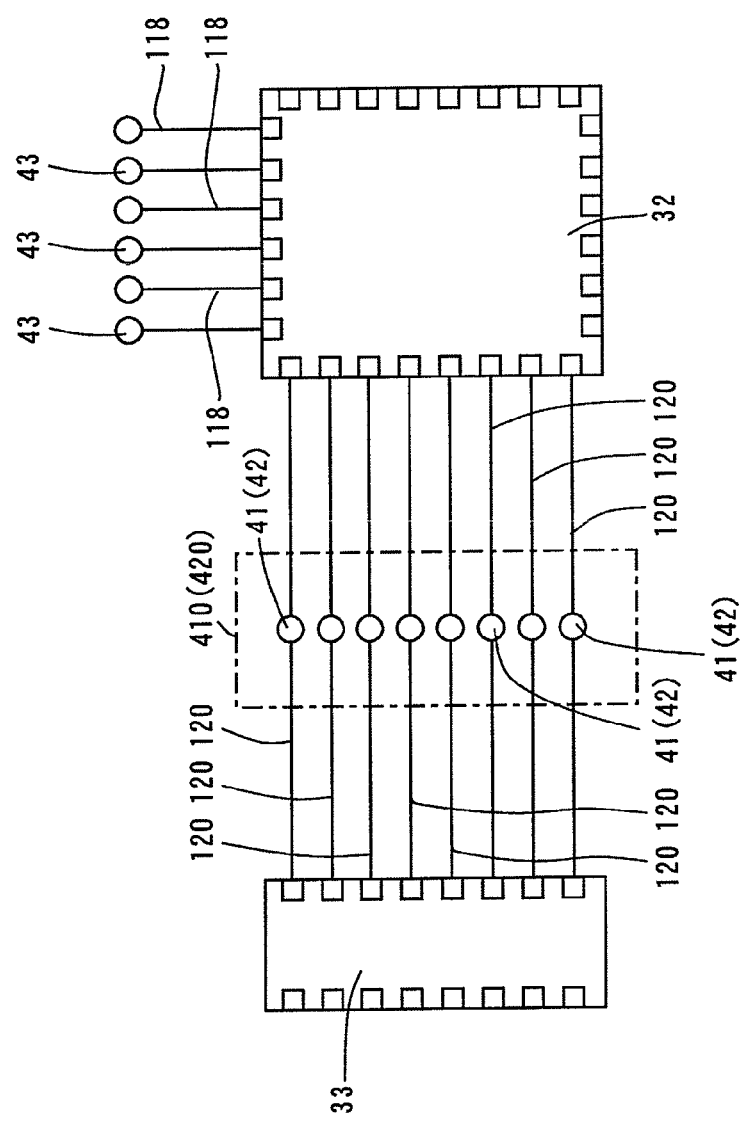
FIG. 15 is a diagram showing an example of the relationship between an LSI and a memory and inspection terminals.

FIG. 15 is a diagram showing an example of the relationship between an LSI 32 and a memory 33 and inspection terminals 41 or 42 in a case where the LSI 32 and the memory 33 are electrically connected to each other on a first board 11.

In FIG. 15, the LSI 32 is electrically connected to solder balls 43, as in FIG. 14. Further, a plurality of terminals of the LSI 32 and a plurality of terminals of the memory 33 are electrically connected, respectively, by a plurality of wiring patterns 120. This causes the LSI 32 and the memory 33 to be electrically connected to each other.

The inspection terminals 41 or 42 are respectively formed on the wiring patterns 120. Consequently, it is possible to inspect respective internal circuits of the LSI 32 and the memory 33 and their signals, as in the above-mentioned embodiments, by using the inspection terminals 41 or 42. In this example, the respective wiring lengths from the LSI 32 and the memory 33 to the inspection terminals 41 or 42 can be sufficiently reduced. This can reliably prevent waveform strains from being respectively induced in inspection signals inputted to the LSI 32 and the memory 33.

Figure 16:
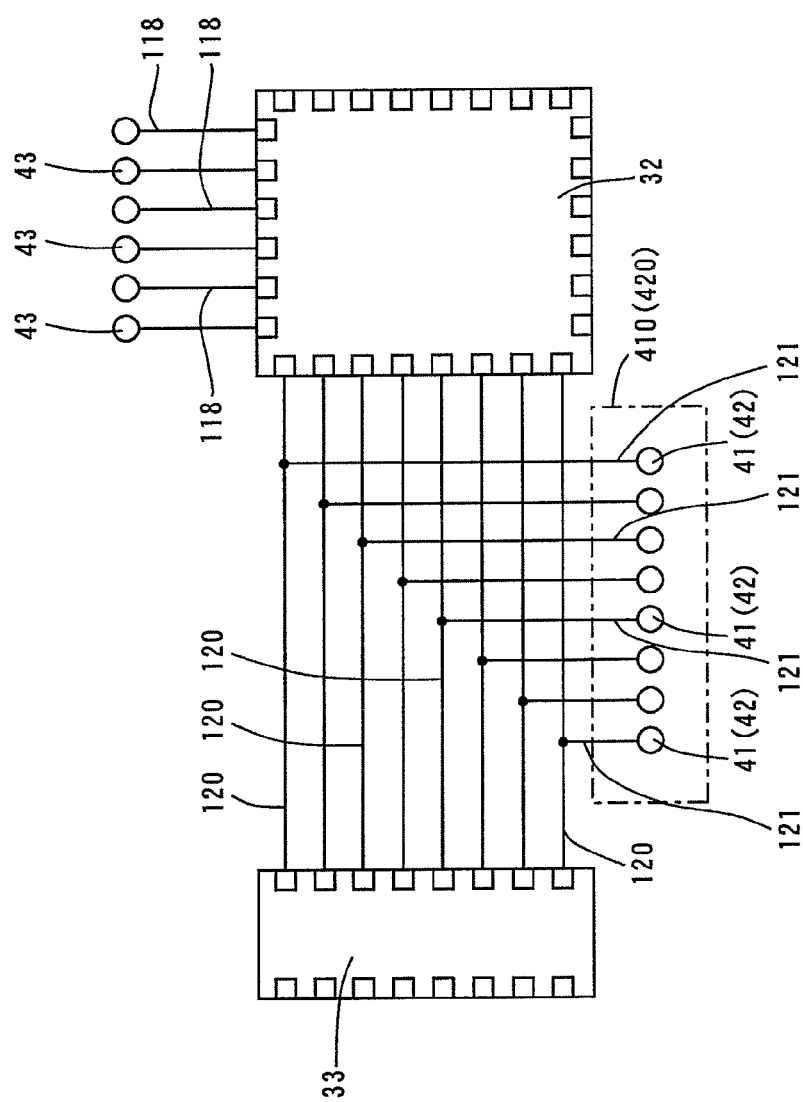
FIG. 16 is a diagram showing another example of the relationship between an LSI and a memory and inspection terminals.

FIG. 16 is a diagram showing another example of the relationship between an LSI 32 and a memory 33 and inspection terminals 41 or 42 in a case where the LSI 32 and the memory 33 are electrically connected to each other and mounted on a first board 11.

The example shown in FIG. 16 differs from the example shown in FIG. 15 in the following points.

In FIG. 16, the inspection terminals 41 or 42 are electrically connected, respectively, to wiring patterns 120 by wiring patterns 121. Thus, the wiring pattern 121 is stub wiring branching off from the wiring pattern 120. Also in this case, it is possible to inspect respective internal circuits of the LSI 32 and the memory 33 and their signals by using the inspection terminals 41 or 42, as in FIG. 15. In this example, respective output signals of the LSI 32 and the memory 33 are pulled out by the wiring patterns 121. Therefore, the wiring patterns 120 can be formed in any path without being affected by the positions of the inspection terminals 41 or 42. Consequently, the degree of freedom of wiring is increased.

The number of electronic components mounted on each of the first to third boards 11 to 13 is not limited to the number described in the above-mentioned embodiments. More electronic components may be mounted on each of the first to third boards 11 to 13. Alternatively, one or two electronic components may be mounted on each of the first to third boards 11.

Although description was made of a case where two or three circuit boards are laminated in the above-mentioned embodiments, four or more circuit boards may be laminated. In this case, the electronic components may be also arranged on each of the circuit boards, and inspection terminals 41 or 42 or inspection terminals 45 may be arranged so as to be exposed upward, as in the above-mentioned embodiments. This allows respective internal circuits of the electronic components and their signals to be inspected with a module board mounted on an external board.

Although each of the electronic components is mounted on the upper surface of each of the boards in the above-mentioned embodiments, the electronic components may be mounted on a lower surface or on both surfaces of each of the boards.

Although the inspection terminals 41 and 42 are provided on the same circuit board in the above-mentioned embodiments, the inspection terminals 41 and 42 may be respectively provided on the different circuit boards. For example, the inspection terminals 41 may be provided on the first board 11, and the inspection terminals 42 may be provided on the second board 12.

Although description was made of a module board of a BGA (Ball Grid Array) type in the above-mentioned embodiments, connector terminals may be provided in place of the solder balls 43 to electrically connect the module board and the external board to each other.

Although description was made of the respective cases where the rectangular concaves 430 and 440 and the rectangular opening 450 are provided, the respective shapes of the concaves 430 and the 440 and the opening 450 are not limited to those in the above-mentioned examples. For example, they may be in another shape such as a circular shape, an elliptical shape, or a polygonal shape. Further, three or more concaves or openings may be formed.

The respective positions where the concaves 430 and 440 and the opening 450 are formed are not limited to those in the above-mentioned examples. For example, they may be formed at the center on a side surface of the module board. Alternatively, they may be formed at four corners of the module board.

Although description was made of the case where the rectangular inspection portions 410 and 420 are provided, the shape of the inspection portions 410 and 420 is not limited to those in the above-mentioned examples. For example, it may be in another shape such as a circular shape, an elliptical shape, or a polygonal shape. Further, three or more inspection portions 410 or 420 may be formed.

The respective positions where the inspection portions 410 and 420 are formed are not limited to those in the above-mentioned examples. For example, they may be formed at the center on an upper surface of the module board, or formed at the center on a side surface of the module board. Alternatively, they may be formed at four corners of the module board.

(10) Correspondences Between Elements in the Claims and Parts in Embodiments

In the following paragraph, non-limiting examples of correspondences between various elements recited in the claims below and those described above with respect to various preferred embodiments of the present invention are explained.

In the embodiments described above, the solder ball 43 corresponds to a first terminal and an external terminal, the inspection terminals 41, 42, and 45 correspond to a second terminal, the molded member 61 corresponds to a sealing layer, the first and second composite sheets 21 and 22 correspond to an insulating layer, the LSI 32 corresponds to a first electronic component, the memories 33 and 34 correspond to a second electronic component, the wiring pattern 111 corresponds to a first wiring part, the wiring patterns 112 to 114 correspond to a second wiring part, and the vias 411, 412, and 421 to 423 correspond to a conductor penetrating a circuit board.

[Industrial Applicability]

The present invention is applicable to various types of electric equipment or electronic equipment, for example.

What is claimed is:

1. A module board comprising:
   a plurality of circuit boards laminated in the vertical direction and each having a wiring pattern;
   one or a plurality of electronic components mounted on at least one of said plurality of circuit boards and electrically connected to said wiring pattern;
   a plurality of first terminals provided on a lower surface of the lowermost one of said plurality of circuit boards and electrically connected to said wiring pattern;
   a plurality of second terminals provided on a partial region on an upper surface of the uppermost one of said plurality of circuit boards and electrically connected to said wiring pattern; and
   a seal formed so as to seal said electronic components while excluding said partial region, on which said plurality of second terminals are provided, wherein
   said plurality of second terminals include terminals that are arranged in a matrix shape on said partial region on the upper surface of said uppermost circuit board and are not electrically connected to any of said plurality of first terminals.

2. The module board according to claim 1, wherein said seal is made of a resin material.

3. The module board according to claim 1, wherein said plurality of second terminals include a plurality of inspection terminals for inspecting any of said electronic components.

4. A module board comprising:
   a plurality of circuit boards laminated in the vertical direction and each having a wiring pattern;
   one or a plurality of electronic components mounted on at least one of said plurality of circuit boards and electrically connected to said wiring pattern;
   a plurality of first terminals provided on a lower surface of the lowermost one of said plurality of circuit boards and electrically connected to said wiring pattern; and
   a plurality of second terminals provided on a partial region on an upper surface of the uppermost one of said plurality of circuit boards and electrically connected to said wiring pattern; and
   a seal formed so as to seal said electronic components while excluding said partial region, on which said plurality of second terminals are provided, wherein
   said plurality of second terminals include terminals that are arranged in a matrix shape on said partial region on the upper surface of said uppermost circuit board and are not electrically connected to any of said plurality of first terminals, and
   a grounding conductor layer is provided on the upper surface of said uppermost circuit board, excluding a wiring region on said uppermost circuit board and the region of said plurality of second terminals and including an upper region of an LSI or a memory mounted on a circuit board below said uppermost circuit board.

5. A module board comprising:
a plurality of circuit boards laminated in the vertical direction and each having a wiring pattern;
one or a plurality of electronic components mounted on at least one of said plurality of circuit boards and electrically connected to said wiring pattern;
a plurality of first terminals provided on a lower surface of the lowermost one of said plurality of circuit boards and electrically connected to said wring pattern;
a plurality of second terminals provided so as to be exposed to a partial region on an upper surface of any one of said plurality of circuit boards and electrically connected to said wiring pattern; and
a seal formed on a region, excluding said partial region, so as to seal said electronic components, no seal being formed in said partial region and wherein
a pitch between said plurality of second terminals is smaller than a pitch between said plurality of first terminals.

6. The module board according to claim 5, wherein said seal is made of a resin material.

7. The module board according to claim 5, wherein said plurality of second terminals include a plurality of inspection terminals for inspecting any of said electronic components.

8. A module board comprising:
a plurality of circuit boards laminated in the vertical direction and each having a wiring pattern;
one or a plurality of electronic components mounted on at least one of said plurality of circuit boards and electrically connected to said wiring pattern;
a plurality of first terminals provided on a lower surface of the lowermost one of said plurality of circuit boards and electrically connected to said wring pattern;
a plurality of second terminals provided so as to be exposed to a partial region on an upper surface of any one of said plurality of circuit boards and electrically connected to said wiring pattern; and
a protector formed on a region, excluding said partial region, so as to cover said electronic components, no protector being formed in said partial region and wherein
a pitch between said plurality of second terminals is smaller than a pitch between said plurality of first terminals.

9. The module board according to claim 8, wherein said plurality of second terminals include a plurality of inspection terminals for inspecting any of said electronic components.

10. A module board comprising:
a plurality of circuit boards laminated in the vertical direction and each having a wiring pattern;
one or a plurality of electronic components mounted on at least one of said plurality of circuit boards and electrically connected to said wiring pattern;
a plurality of first terminals provided on a lower surface of the lowermost one of said plurality of circuit boards and electrically connected to said wring pattern;
a plurality of second terminals provided on a peripheral region along at least one side of an upper surface of the uppermost one of said plurality of circuit boards and electrically connected to said wiring pattern; and
a seal formed on a region, excluding said peripheral region on the upper surface of said uppermost circuit board, so as to seal said one or plurality of electronic components, no seal being formed in said peripheral region and wherein
a pitch between said plurality of second terminals is smaller than a pitch between said plurality of first terminals.

11. The module board according to claim 10, wherein said seal is made of a resin material.

12. The module board according to claim 10, wherein said plurality of second terminals include a plurality of inspection terminals for inspecting any of said electronic components.

\* \* \* \* \*